(12) United States Patent
Hanson et al.

(10) Patent No.: US 10,916,381 B2
(45) Date of Patent: Feb. 9, 2021

(54) MODULATING ELECTRON TRANSFER DYNAMICS AT HYBRID INTERFACES VIA SELF-ASSEMBLED MULTILAYERS

(71) Applicant: The Florida State University Research Foundation, Inc., Tallahassee, FL (US)

(72) Inventors: Kenneth Hanson, Tallahassee, FL (US); Jamie Wang, Tallahassee, FL (US); Tanmay Banerjee, Tallahassee, FL (US); Omotola Ogunsolu, Tallahassee, FL (US)

(73) Assignee: The Florida State University Research Foundation. Inc., Tallahassee, FL (US)

( * ) Notice: Subject to any disclaimer, the term of this patent is extended or adjusted under 35 U.S.C. 154(b) by 400 days.

(21) Appl. No.: 15/325,788

(22) PCT Filed: Jul. 14, 2015

(86) PCT No.: PCT/US2015/040252
§ 371 (c)(1),
(2) Date: Jan. 12, 2017

(87) PCT Pub. No.: WO2016/018609
PCT Pub. Date: Feb. 4, 2016

(65) Prior Publication Data
US 2017/0200563 A1  Jul. 13, 2017
US 2018/0019068 A9  Jan. 18, 2018

Related U.S. Application Data

(60) Provisional application No. 62/030,297, filed on Jul. 29, 2014.

(51) Int. Cl.
*H01G 9/20* (2006.01)
*H01L 51/42* (2006.01)
(Continued)

(52) U.S. Cl.
CPC ........ *H01G 9/2059* (2013.01); *H01G 9/2036* (2013.01); *H01L 51/0086* (2013.01);
(Continued)

(58) Field of Classification Search
CPC ......... H01L 2031/0344; H01L 51/0086; H01L 51/422; H01G 9/2059; H01G 9/2036
See application file for complete search history.

(56) References Cited

U.S. PATENT DOCUMENTS 4,994,429 A * 2/1991 Wieserman .......... B01J 20/3248
210/198.2
2005/0093107 A1  5/2005 Bao et al.
(Continued)

FOREIGN PATENT DOCUMENTS

WO  2013142595 A1  9/2013

OTHER PUBLICATIONS

Obeng, et al., Langmuir, 1991, vol. 7, No. 1, pp. 195-201 (Year: 1991).*
(Continued)

*Primary Examiner* — Sadie White
(74) *Attorney, Agent, or Firm* — Armstrong Teasdale LLP

(57) ABSTRACT

Forward and back electron transfer at molecule oxide interfaces are pivotal events in dye-sensitized solar cells, dye-sensitized photoelectrosynthesis cells and other applications. Disclosed herein are self-assembled multilayers as a strategy for manipulating electron transfer dynamics at these interfaces. The multilayer films are achieved by stepwise layering of bridging molecules, linking ions, and active molecule on an oxide surface. The formation of the proposed architecture is supported by ATR-IR and UV-Vis spectroscopy. Time-resolved emission and transient absorption establishes that the films exhibit an exponential decrease in electron transfer rate with increasing bridge length. The (Continued)

findings indicate that self-assembled multilayers offer a simple, straight forward and modular method for manipulating electron transfer dynamics at dye-oxide interfaces.

4 Claims, 9 Drawing Sheets

(51) Int. Cl.
  *H01L 51/00* (2006.01)
  *H01L 31/0256* (2006.01)
(52) U.S. Cl.
  CPC ......... *H01L 51/422* (2013.01); *H01G 9/2031* (2013.01); *H01L 2031/0344* (2013.01); *Y02E 10/542* (2013.01); *Y02E 10/549* (2013.01)

(56) References Cited

U.S. PATENT DOCUMENTS

| | | | |
|---|---|---|---|
| 2008/0206890 A1* | 8/2008 | Burstyn | ............ C07F 1/005 436/525 |
| 2009/0179269 A1 | 7/2009 | Hook et al. | |
| 2013/0327386 A1* | 12/2013 | Xu | ............ H01G 9/2036 136/256 |

OTHER PUBLICATIONS

Massari, et al., Polyhedron, 2003, 22, pp. 3065-3072. (Year: 2003).*
Hanson, et al., Angewandte Chemie International Edition, 2012, vol. 51, pp. 12782-12785. (Year: 2012).*
Snover, et al., Chemistry of Materials, 1996, 8, 1490-1499 (Year: 1996).*
Bettis, Stephanie E. et al., Photophysical Characterization of a Chromophore/Water Oxidation Catalyst Containing a Layer-by-Layer Assembly on Nanocrystalline TiO2 Using Ultrafast Spectroscopy, The Journal of Physical Chemistry, 2014, vol. 118, pp. 10301-10308.
Hanss, David et al., Importance of covalence, conformational effects and tunneling-barrier heights for long-range electron transfer: Insights from dyads with oligo-p-phenylene, oligo-p-xylene and oligo-p-dimethoxybenzene bridges, Coordination Chemistry Reviews, 2010, vol. 254, pp. 2584-2592 Elsevier B.V.
Wang, James C. et al., Modulating Electron Transfer Dynamics at Dye-Semiconductor Interfaces via Self-Assembled Bilayers, Journal of Physical Chemstry, 2015, vol. 119, pp. 3502-3508, ACS Publications.
International Search Report and Written Opinion of the International Searching Authority regarding PCT/US2015/40252 dated Jul. 14, 2015; pp. 1-18.
U.S. Appl. No. 62/030,297, filed Jul. 29, 2014, pp. 1-69.
Bangle et al., "Electron Transfer Reorganization Energies in the Electrode—Electrolyte Double Layer", J. Am. Chem. Soc., 2020, vol. 142, pp. 674-679.
Bangle et al., "Kinetic Evidence That the Solvent Barrier for Electron Transfer Is Absent in the Electric Double Layer", J. Am. Chem. Soc., 2020, vol. 142, pp. 14940-14946.

* cited by examiner

MODULATING ELECTRON TRANSFER DYNAMICS AT HYBRID INTERFACES VIA SELF-ASSEMBLED MULTILAYERS

CROSS REFERENCE TO RELATED APPLICATIONS

This application is a U.S. national stage application based on International Application No. PCT/US2015/040252, which was filed Jul. 14, 2015 and has published as International Publication No. WO 2016/018609. International Application No. PCT/US2015/040252 claims priority to U.S. Provisional Application Ser. No. 62/030,297, which was filed Jul. 29, 2014. Both priority applications are hereby incorporated by reference as if set forth in their entirety.

FIELD OF THE INVENTION

The present invention relates to the control of electron transfer at oxide interfaces via a multilayer assembly containing a molecular bridge, metal ion, and an active molecule. The structure of the molecular bridge and metal ion dictates the rate and mechanism of electron transfer.

BACKGROUND OF THE INVENTION

Electron transfer at organic-inorganic hybrid interfaces is a critical event in bio/organic electronics, solar energy conversion, electrocatalysis, sensing and other applications. See Queffélec, Clémence; Petit, Marc; Janvier, Pascal; Knight, D. Andrew; Bujoli, Bruno Surface Modification Using Phosphonic Acids and Esters. *Chemical Reviews* 2012, 112, 3777-3807. For example, electron transfer from a photoexcited chromophore to a semiconducting metal oxide surface is a critical event in dye-sensitized solar cells (DSSCs) and dye-sensitized photoelectrosynthesis cells (DSPECs). See Swierk, J. R.; Mallouk, T. E. *Chemical Society Reviews* 2013, 42, 2357; Ardo, S.; Meyer, G. J. *Chemical Society Reviews* 2009, 38, 115; and Durrant, J. R.; Hague, S. A.; Palomares, E. *Coordination Chemistry Reviews* 2004, 248, 1247. At the interfaces in these devices, the goal is to maximize the rate of electron transfer in one direction (forward electron transfer, FET). Equally important is the inhibition of the back electron transfer (BET), that is, an electron in the metal oxide returning to the oxidized dye/electrolyte/substrate. In DSSCs, slowing BET rates by one order of magnitude can increase the open circuit voltage by 50 mV or more. See Hardin, B. E.; Snaith, H. J.; McGehee, M. D. *Nat Photon* 2012, 6, 162. In DSPECs, BET must be slowed by several orders of magnitude for the build-up of redox equivalents, and catalysis, to be competitive with the BET loss pathway.

It is generally accepted that there is a barrier to electron transfer across dissimilar materials like inorganics and organics. See Queffélec, Clémence; Petit, Marc; Janvier, Pascal; Knight, D. Andrew; Bujoli, Bruno Surface Modification Using Phosphonic Acids and Esters. *Chemical Reviews* 2012, 112, 3777-3807; and Hanson, Eric L.; Guo, Jing; Koch, Norbert; Schwartz, Jeffrey; Bernasek, Steven L. Advanced Surface Modification of Indium Tin Oxide for Improved Charge Injection in Organic Devices. *Journal of the American Chemical Society* 2005, 127, 10058-10062. One strategy to facilitate/control electron transfer at hybrid interfaces is to incorporate a surface bound "molecular bridge" between the active organic material and the inorganic metal oxide. See FIG. 1 for a depiction of electron transfer between an organic active material and an oxide electrode ($M_xO_y$) through a bridging molecule. FIG. 1 depicts electron transfer in the forward direction (forward electron transfer, or FET) from active material to the oxide and the backward direction (back electron transfer, or BET) from the oxide to the active material. Electrode modification with organic molecules has been explored in organic photovoltaics (OPVs) as a means of modifying the electrode work function. See Hanson, Eric L.; Guo, Jing; Koch, Norbert; Schwartz, Jeffrey; Bernasek, Steven L. Advanced Surface Modification of Indium Tin Oxide for Improved Charge Injection in Organic Devices. *Journal of the American Chemical Society* 2005, 127, 10058-10062; Li, Hong; Ratcliff, Erin L.; Sigdel, Ajaya K.; Giordano, Anthony J.; Marder, Seth R.; Berry, Joseph J.; Brédas, Jean-Luc Modification of the Gallium-Doped Zinc Oxide Surface with Self-Assembled Monolayers of Phosphonic Acids: A Joint Theoretical and Experimental Study. *Advanced Functional Materials* 2014, ASAP; and Sharma, Asha; Haldi, Andreas; Hotchkiss, Peter J.; Marder, Seth. R.; Kippelen, Bernard Effect of phosphonic acid surface modifiers on the work function of indium tin oxide and on the charge injection barrier into organic single-layer diodes. *Journal of Applied Physics* 2009, 105, 074511.

In dye-sensitized devices, photoexcitation of the dye is followed by electron transfer to the semiconducting electrode (FET). In an ideal device, the electron will enter the external circuit and perform useful work. One of the primary loss pathways in these devices is BET from the semiconductor to the active material. Slowing deleterious BET in a DSSC by one order of magnitude can increase the open circuit voltage by up to 50 mV. See Hardin, Brian E.; Snaith, Henry J.; McGehee, Michael D. The renaissance of dye-sensitized solar cells. *Nature Photonics* 2012, 6, 162-169. In DSPECs, for multiple electron oxidation/reduction events, BET must be slowed by several orders of magnitude for the buildup of redox equivalents and catalysis to be competitive with the BET loss pathway. See Swierk, J. R.; Mallouk, T. E. *Chemical Society Reviews* 2013, 42, 2357.

Considerable efforts have been dedicated to slowing BET at dye-sensitized interfaces by covalently modifying the dye molecules with rigid bridging moieties. These bridging moieties are designed to spatially separate the dye from the metal oxide surface as a means of slowing electron transfer. See Ardo, Shane; Meyer, Gerald J. Photodriven heterogeneous charge transfer with transition-metal compounds anchored to $TiO_2$ semiconductor surfaces. *Chemical Society Reviews* 2009, 38, 115-164; Galoppini, Elena Linkers for anchoring sensitizers to semiconductor nanoparticles. *Coordination Chemistry Reviews* 2004, 248, 1283-1297. In addition to requiring a relatively complex synthesis, these elongated bridge-dyes have a tendency to lie down on the surface effectively negating the desired bridging affect. See Wang, Dong; Mendelsohn, Richard; Galoppini, Elena; Hoertz, Paul G.; Carlisle, Rachael A.; Meyer, Gerald J. Excited State Electron Transfer from Ru(II) Polypyridyl Complexes Anchored to Nanocrystalline $TiO_2$ through Rigid-Rod Linkers. *The Journal of Physical Chemistry B* 2004, 108, 16642-16653; Piotrowiak, Piotr; Galoppini, Elena; Wei, Qian; Meyer, Gerald J.; Wiewiór, Piotr Subpicosecond Photoinduced Charge Injection from "Molecular Tripods" into Mesoporous $TiO_2$ Over the Distance of 24 Angstroms. *Journal of the American Chemical Society* 2003, 125, 5278-5279; Myahkostupov, Mykhaylo; Piotrowiak, Piotr; Wang, Dong; Galoppini, Elena Ru(II)-Bpy Complexes Bound to Nanocrystalline $TiO_2$ Films through Phenyleneethynylene (OPE) Linkers: Effect of the Linkers Length on Electron Injection Rates. *The Journal of Physical Chemistry C* 2007, 111, 2827-2829; and Kilså, Kristine; Mayo, Elizabeth I.; Kuciauskas, Darius; Villahermosa, Randy; Lewis, Nathan S.; Winkler, Jay R.; Gray, Harry B. Effects of Bridging Ligands on the Current—Potential Behavior and Interfacial Kinetics of Ruthenium-Sensitized Nanocrystalline $TiO_2$ Photoelectrodes. *The Journal of Physical Chemistry A* 2003, 107, 3379-3383. Recent results by Meyer and co-workers showed that with some molecule-bridges, this strategy can be effective in slowing BET. See Johansson, Patrik G.; Kopecky, Andrew; Galoppini, Elena; Meyer, Gerald J. Distance Dependent Electron Transfer at $TiO_2$ Interfaces Sensitized with Phenylene Ethynylene Bridged $Ru^{II}$-Isothiocyanate Compounds. *Journal of the American Chemical Society* 2013, 135, 8331-8341. However, spatial separations with these types of bridging motifs indiscriminately slows both FET and BET. Thus, FET rate and injection yield are being significantly reduced in these systems.

SUMMARY OF THE INVENTION

Among the provisions of the present invention may be noted a multilayer structure. The structure comprises a substrate comprising a metal oxide surface and a bulk region; and a self-assembled multilayer film, the film comprising: (a) a bridging molecule covalently bonded to the metal oxide surface; (b) a linking coordinating metal ion bonded to the bridging molecule; and (c) an active moiety selected from the group consisting of a chromophore, a catalyst, and an electroactive molecule bonded to the linking coordinating metal ion.

The present invention is additionally directed to an electrode, a dye-sensitized solar cell, or a dye-sensitized photoelectrochemical cell comprising the multilayer structure.

Still further, the present invention is directed to a method of preparing a self-assembled multilayer film on a substrate comprising a metal oxide surface and a bulk region. The method comprises contacting the metal oxide surface with a bridging molecule having the general structure $(L_1)$-(A)-$(L_2)$ to thereby form a covalently bonded self-assembled monolayer on the surface of the metal oxide, wherein $L_1$ and $L_2$, are each independently a metal ion chelating moiety or a metal bonding moiety selected from the group consisting of —COOH, —$PO_3H_2$, —$SO_3H$, —$OPO_3H$, —$OSO_3H$, —$SiO_3$, -Ph(OH)$_2$, —CH(CO$_2$H)$_2$, —CH═C(CN)CO$_2$H, —CH═C(CO$_2$H)$_2$, —CONHOH, —CSSH, —CSOH, and any combination thereof, and A is one or more bridging moieties selected from the group consisting of alkyl, alkenyl, alkynyl, aromatic, heteroaromatic, heterocycloalkyl, cycloalkyl, and combinations thereof; contacting the self-assembled monolayer on the surface of the metal oxide with a compound comprising a linking coordinating metal ion selected from the group consisting of $Cu^{2-}$, $Co^{2+}$, $Ni^{2-}$, $Zn^{2+}$, $Mn^{2+}$, $Fe^{2+}$, $Sr^{2+}$, $Al^{3+}$, $V^{3+}$, $In^{3+}$, $Fe^{3+}$, $Gd^{3+}$, $Y^{3+}$, $Yb^{3+}$, $Nd^{3+}$, $Ce^{3-}$, $La^{3+}$, $Sc^{3+}$, Dy3+, $Zr^{4+}$, $Ti^{4+}$, $Sn^{4+}$, and combinations thereof, to thereby incorporate a coordinating metal into the self-assembled monolayer on the surface of the metal oxide; and contacting the linking coordinating metal ion in the self-assembled monolayer on the surface of the metal oxide with an active moiety selected from the group consisting of a chromophore, a catalyst, and an electroactive molecule bonded to the linking coordinating metal ion, to thereby bond the active moiety to the linking coordinating metal.

Other objects and features will be in part apparent and in part pointed out hereinafter.

BRIEF DESCRIPTION OF THE DRAWING(S)

DETAILED DESCRIPTION OF THE EMBODIMENT(S) OF THE INVENTION

The present invention is directed to a multilayer structure comprising self-assembled multilayers, as a means of controlling the distance between an active moiety (e.g., a chromophore, a catalyst, and an electroactive molecule) and a metal oxide surface. This approach, based on the work of Mallouk and Haga (See Terada, K.; Kobayashi, K.; Hikita, J.; Haga, M.-a. *Chemistry Letters* 2009, 38, 416; and Lee, H.; Kepley, L. J.; Hong, H. G.; Mallouk, T. E. *Journal of the American Chemical Society* 1988, 110, 618.), provides a simple and modular method for the self-assembly of multilayer structures on metal oxide surfaces via metal ion linkages. This stepwise assembly method has been successfully implemented with chromophore-catalyst and chromophore-chromophore assemblies. See Hanson, K.; Torelli, D. A.; Vannucci, A. K.; Brennaman, M. K.; Luo, H.; Alibabaei, L.; Song, W.; Ashford, D. L.; Norris, M. R.; Glasson, C. R. K.; Concepcion, J. J.; Meyer, T. J. *Angewandte Chemie International Edition* 2012, 51, 12782; Bettis, S. E.; Hanson, K.; Wang, L.; Gish, M. K.; Concepcion, J. J.; Fang, Z.; Meyer, T. J.; Papanikolas, J. M. *The Journal of Physical Chemistry A* 2014; Nayak, A.; Knauf, R. R.; Hanson, K.; Alibabaei, L.; Concepcion, J. J.; Ashford, D. L.; Dempsey, J. L.; Meyer, T. J. *Chemical Science* 2014; and Ding, X.; Gao, Y.; Zhang, L.; Yu, Z.; Liu, J.; Sun, L. *ACS Catalysis* 2014, 2347. The incorporation of a molecular bridge into self-assembled multilayer films is an effective strategy for modulating electron transfer dynamics at the semiconductor-dye interface.

Figure 1:
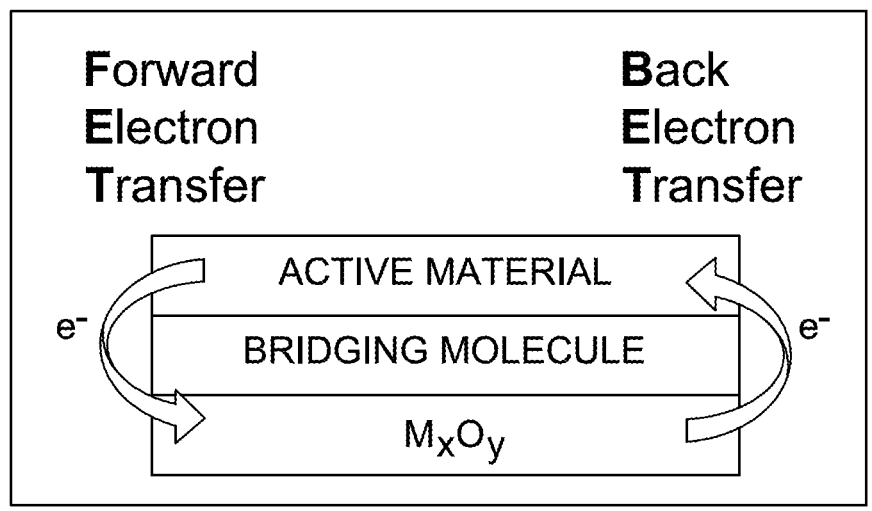
FIG. 1 is a depiction of electron transfer between an organic active material and a metal oxide electrode ($M_xO_y$) through a bridging molecule.
Figure 2A:
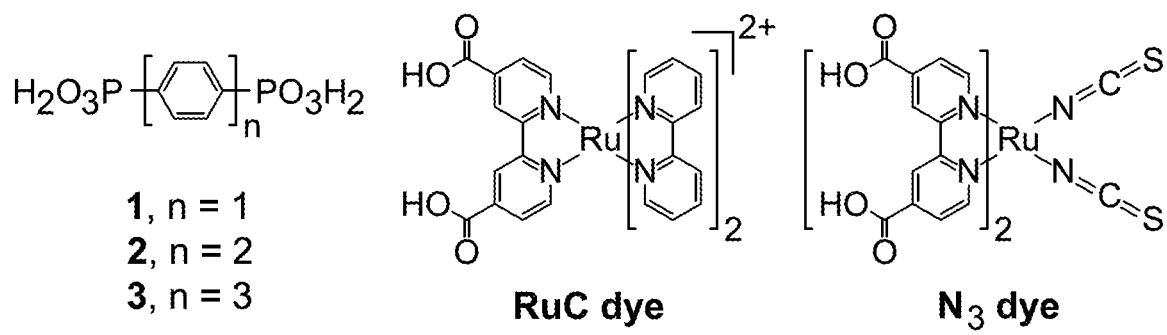
FIG. 2A is a depiction of the molecular components suitable for the preparation of exemplary, non-limiting multilayer structures according to the present invention. These include the chromophores, RuC and N3, and molecular spacers 1, 2, and 3.
Figure 2B:
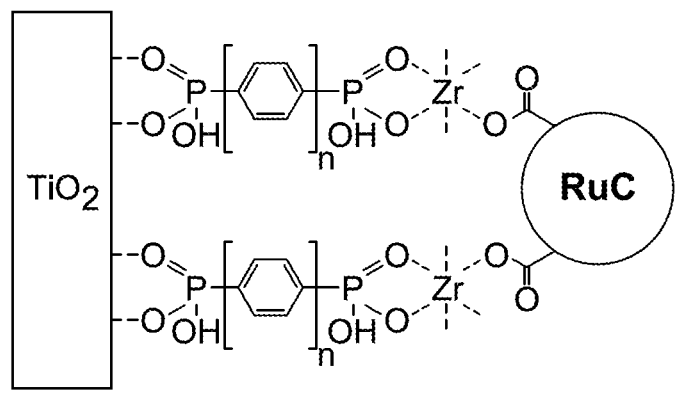
FIG. 2B is a schematic representation of an exemplary, non-limiting multilayer film assembly according to the present invention in which the chromophore is RuC.

In one non-limiting, exemplary embodiment of the invention, multilayer films ($TiO_2$—(X)—Zr—RuC) are composed of a metal oxide electrode ($TiO_2$), a bridging molecule (X=1, 2 or 3 bridging molecules bonded to the metal oxide electrode), $Zr^{4+}$ ions, and a chromophore ($[Ru(bpy)_2(4,4'-(COOH)_2bpy)]^{2-}$, RuC) as depicted in FIGS. 2A and 2B. Additional details regarding this embodiment, and others, are provided below in this disclosure and in the examples.

Figure 2C:
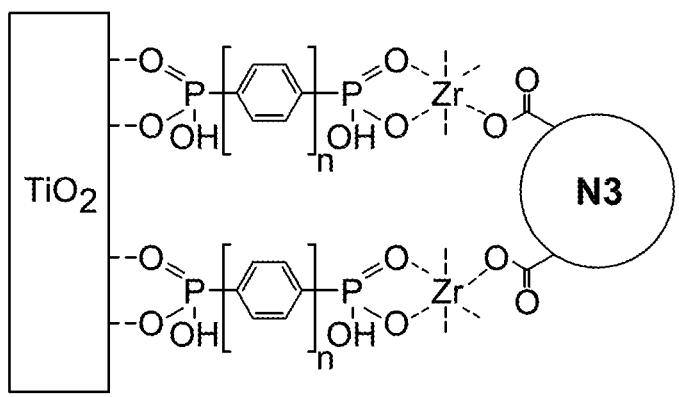
FIG. 2C is a schematic representation of an exemplary, non-limiting multilayer film assembly according to the present invention in which the chromophore is N3.

In one non-limiting, exemplary embodiment of the invention, multilayer films ($TiO_2$—(X)—Zr—N3) are composed of a metal oxide electrode ($TiO_2$), a bridging molecule (X=1, 2 or 3 bridging molecules bonded to the metal oxide electrode), $Zr^{4+}$ ions, and a chromophore ($[Ru(bpy)_2(4,4'-(COOH)_2(NCS)_2)]$, N3) as depicted in FIGS. 2A and 2C. Additional details regarding this embodiment, and others, are provided below in this disclosure and in the examples.

In general, the present invention is directed to a multilayer structure comprising a multilayer, self-assembled film on a surface having conducting, semiconducting, or insulating properties. The surface is part of a substrate.

The substrate may have a uniform composition throughout, or may comprise a core or bulk region and a different surface region, e.g., a core-shell composition. In some embodiments, the substrate comprises a metal oxide surface region and a bulk region.

In some embodiments, the substrate comprises a metal, such as, for example, copper, nickel, gold, silver, platinum, steel, glassy carbon, silicon, and alloys comprising one or more thereof. The metal may be the entire substrate, a core region material, or a shell/surface region material.

In some embodiments, the substrate comprises a metal oxide. The metal oxide may be the entire substrate, a core region material, or a shell/surface region material. In some embodiments, the surface region material is a metal oxide chosen from $SiO_2$, $SnO_2$, $TiO_2$, $Nb_2O_5$, $SrTiO_3$, ZnO, $Zn_2SnO_4$, $ZrO_2$, NiO, Ta-doped $TiO_2$, Nb-doped $TiO_2$, and combinations of two or more thereof. In other embodiments, the metal oxide comprises $TiO_2$, such as nanocrystalline $TiO_2$. In further embodiments, the metal oxide comprises NiO. In still other embodiments, the surface region comprises $ZrO_2$, such as nanoparticles of $ZrO_2$. In some embodiments, the entire substrate comprises the metal oxide material. In some embodiments, the metal oxide surface region is a layer coating a different bulk region material. For example, core-shell nanostructures are also possible. In some embodiments, a core-shell nanostructure may comprise one or more of: ZnO-coated $SnO_2$, MgO-coated $SnO_2$, $Al_2O_3$-coated $SnO_2$, $TiO_2$-coated In-doped $SnO_2$, and $TiO_2$-coated F-doped $SnO_2$. In some embodiments, the metal oxide surfaces provide a conducting surface. In some embodiments, the metal oxide surfaces provide a semiconducting surface. In some embodiments, the metal oxide surface provides an insulating surface. Methods of making various metal oxide materials are known to those of ordinary skill in the art.

In some embodiments, the metal oxide surface is planar. In some embodiments, the metal oxide surface has a higher surface area than a planar or flat surface. A high surface area means a surface area greater than a flat surface on the microscopic scale, such as is available on a single crystal. A high surface area can be achieved by any suitable means, such as, for example, by fusing particles together, or by etching a surface to introduce porosity. Some embodiments provide at least some of the metal oxide in the form of nanoparticles, nanocrystals, nanocolumns, nanotubes, nanosheets, nanoscrolls, nanowires, nanotips, nanoflowers, nanohorns, nano-onions, dendritic nanowires, or a combination of two or more thereof. Methods of making various forms of high surface area metal oxides are known to those of ordinary skill in the art. Examples of materials that may be suitable for some embodiments of the present invention appear in International Publication No. WO 2011/142848 to Corbea et al.

According to the present invention, the substrate, and more specifically, the metal oxide surface region, is coated with a self-assembled multilayer film, the film comprising: (a) a bridging molecule covalently bonded to the metal oxide surface; (b) a linking coordinating metal ion; and (c) an active moiety selected from the group consisting of a chromophore, a catalyst, and an electroactive molecule bonded to the linking coordinating metal ion.

The multilayer film may comprise one or more materials, i.e., a bridging molecule, which self-assembles onto the metal oxide surface, for example, via a surface linking group. In some embodiments, the self-assembled bridging molecule is covalently bonded to the metal oxide surface.

In some embodiments, the bridging molecule covalently bonded to the metal oxide surface comprises a surface linking moiety, (which may be designated "L" herein and particularly in the structures provided in this disclosure), and a bridging moiety, (which may be designated "A" herein and particularly in the structures provided in this disclosure). A surface linking group, L, may include a metal ion chelating moiety or a metal bonding moiety. In some embodiments, the surface linking group is capable of both chelating metal ions and covalently bonding to metals and/or metal ions. In some embodiments, the surface linking group is selected from among —COOH, —$PO_3H_2$, —$SO_3H$, —$OPO_3H$, —$OSO_3H$, —$SiO_3$, -Ph(OH)$_2$, —CH(CO$_2$H)$_2$, —CH=C(CN)CO$_2$H, —CH=C(CO$_2$H)$_2$, —CONHOH, —CSSH, —CSOH, and combinations thereof. In some embodiments, the bridging molecule comprises two or more surface linking groups, such as 2, 3, 4, 5 or more surface linking groups. In the context of structures of the invention, the surface linking groups, L, may be designated numerically, e.g., $L_1$, $L_2$, $L_3$, $L_4$, $L_5$, etc.

In some embodiments, the bridging moiety, A, is one or more moiety selected from the group consisting of alkyl, alkenyl, alkynyl, aromatic, heteroaromatic, heterocycloalkyl, cycloalkyl, and combinations thereof. In some embodiments, the bridging moiety, A, may comprise one or more than one of alkyl, alkenyl, alkynyl, aromatic, heteroaromatic, heterocycloalkyl, and cycloalkyl, for example, one of such groups, two, three, four, or more such groups. In some embodiments, in which A comprises multiple alkyl, alkenyl, alkynyl, aromatic, heteroaromatic, heterocycloalkyl, or cycloalkyl, all groups may be identical. In some embodiments, in which A comprises multiple alkyl, alkenyl, alkynyl, aromatic, heteroaromatic, heterocycloalkyl, or cycloalkyl, some of the groups may be different from each other.

In the context of the present disclosure, unless otherwise stated, an alkyl substituent group or an alkyl moiety in a substituent group may be linear or branched. The alkyl group may comprise from one to about 20 carbon atoms, such as from one to about six carbon atoms. Examples of $C_{1-6}$ alkyl groups/moieties include methyl, ethyl, n-propyl, isopropyl, n-butyl, iso-butyl, tert-butyl, n-pentyl, n-hexyl, etc.

In the context of the present disclosure, unless otherwise stated, an alkenyl substituent group or an alkenyl moiety in a substituent group may be linear or branched. The alkenyl group may comprise from two to about 20 carbon atoms, such as from two to about six carbon atoms. Examples of $C_{2-6}$ alkenyl groups/moieties include ethenyl, n-propenyl, isopropenyl, n-butenyl, iso-butenyl, tert-butenyl, n-pentenyl, n-hexenyl, etc.

In the context of the present disclosure, unless otherwise stated, an alkynyl substituent group or an alkynyl moiety in a substituent group may be linear or branched. The alkynyl group may comprise from two to about 20 carbon atoms, such as from two to about six carbon atoms. Examples of $C_{2-6}$ alkynyl groups/moieties include ethynyl, n-propynyl, isopropynyl, n-butynyl, iso-butynyl, tert-butynyl, n-pentynyl, n-hexynyl, etc.

In the context of the present disclosure, cycloalkyl is a non-aromatic ring that can comprise one, two or three non-aromatic rings, and is, optionally, fused to a benzene ring (for example to form an indanyl, or 1,2,3,4-tetrahydronaphthyl ring). The cycloalkyl group may comprise from three to about 20 carbon atoms, such as from three to about eight carbon atoms. Examples of cycloalkyl include cyclopropyl, cycobutyl, cyclopentyl, cyclohexyl, cycloheptyl, cyclooctyl, bicyclo[2.2.1]heptyl, bicylco[3.2.1]octyl, cyclopentenyl, bicylco[3.2.2]nonyl, cyclohexenyl or adamantyl. In heterocycloalkyl, one or more carbon atoms are substituted with nitrogen, oxygen, or sulfur.

In the context of the present disclosure, aromatic or aryl encompasses aromatic moieties comprising from six to about 26 carbon atoms, such as from six to about fourteen carbon atoms. Aromatic may include benzene, naphthalene, phenanthrene, anthracene, pyrene, tetracene, pyridine, pyrimidine, pyrazine, pyridazine, triazines, pyrrole, imidazole, triazoles, quinoline, cinnoline, quinazoline, quinoxaline, naphthyridines, indole, indazoles, benzoimidazole, benzotriazoles, purines, furan, benzofuran, thiophene, benzothiophene, and so on.

In the context of the present disclosure, heteroaromatic or heteroaryl encompasses aromatic moieties comprising carbon and one or more of nitrogen, sulfur, or oxygen in an aromatic ring system. Heteroaromatic may comprise from one to about 26 carbon atoms, such as from three to about fourteen carbon atoms. Heteroaromatic may include pyridine, pyrimidine, pyrazine, pyridazine, triazines, pyrrole, pyrazole, imidazole, triazoles, quinoline, isoquinoline, cinnoline, quinazoline, quinoxaline, naphthyridines, indole, indazoles, benzoimidazole, benzotriazoles, pyrrolopyridines, pyrazolopyridines, imidazopyridines, triazolopyridines, pyrrolopyridazines, pyrazolopyridazines, imidazopyridazines, triazolopyridazines, pyrrolopyrimidines, pyrazolopyrimidines, purines, triazolopyrimidines, pyrrolopyrazines, pyrazolopyrazines, imidazopyrazines, triazolopyrazines, and so on.

In some embodiments, the bridging moiety, A, may be substituted with, e.g., halo (Cl, Br, F, or I), haloalkyl, cyano, amino (including primary, secondary, tertiary alkyl amines), and so on.

In some embodiments, the bridging moiety, A, may comprise one or more moiety selected from among the following:

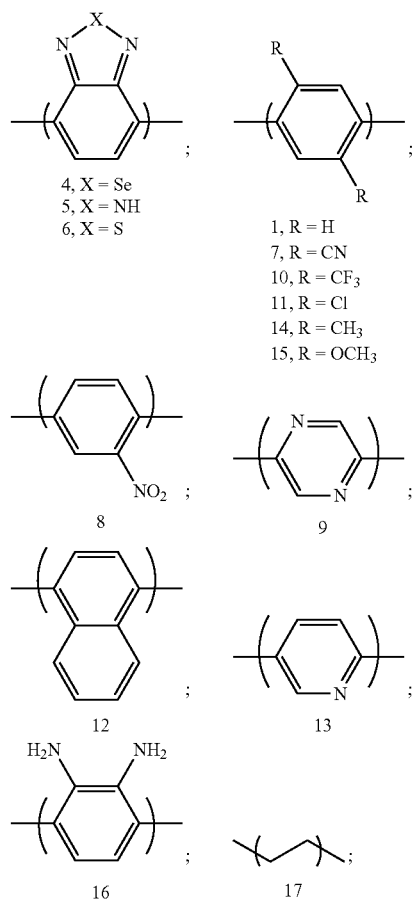

and combinations thereof.

In some preferred embodiments, the bridging molecule may comprise one or more selected from among the following:

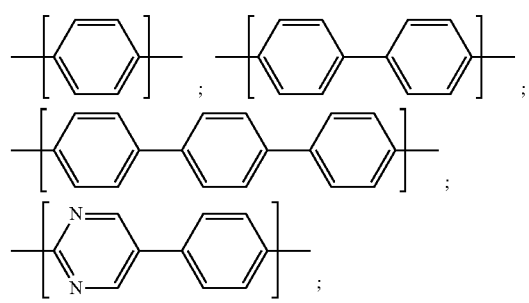

-continued

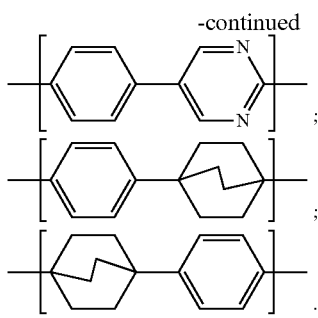

In some embodiments, the multilayer film comprises one or more of a linking coordinating metal ion. The linking coordinating metal ion may coordinate with one or more atoms of the surface linking group of the bridging molecule, and further may coordinate with one or more atoms of the active moiety, which is disclosed in greater detail below. Mutual coordination to one ion, but any suitable numbers of ions can be employed. In some embodiments, two, three, four, five, six, or more ions coordinate the bridging molecule to the active moiety. Also, each assembly need not coordinate the same ratio of first molecules to second molecules. Steric interactions and other factors may cause one first molecule to coordinate to just one second molecule, while another first molecule might coordinate to more than one second molecule. Also, as can be appreciated, one molecule may coordinate to more than one other molecule. In some embodiments, the ion is chosen from $Cu^{2+}$, $Co^{2+}$, $Ni^{2+}$, $Zn^{2+}$, $Mn^{2+}$, $Fc^{2-}$, $Sr^{2+}$, $Al^{3+}$, $V^{3+}$, $In^{3+}$, $Fe^{3+}$, $Gd^{3+}$, $Y^{3+}$, $Yb^{3+}$, $Nd^{3+}$, $Ce^{3+}$, $La^{3+}$, $Sc^{3+}$, $Dy^{3+}$, $Zr^{4+}$, $Ti^{4+}$, $Sn^{4+}$, and combinations thereof In certain embodiments, the ion is $Zn^{2+}$. In certain other embodiments, the ion is $Co^{2+}$. In still other embodiments, the ion comprises a zirconium ion. As used herein, the ion can be in any suitable form. In some cases, the ion has no detectable bond, ionic or otherwise, to any species other than to the molecules of the assembly. In other cases, the ion may be in the presence of one or more counter-ions and/or other compounds. For example, an oxygen anion or chloride anion could be found in proximity to a $Zr^{4+}$ ion. In another example, one or more solvent compounds could coordinate to the ion as it joins the molecules of the assembly."

In some embodiments, the active moiety is selected from among a chromophore, a catalyst, and an electroactive molecule. The active moiety is bonded to the linking coordinating metal ion. Active moieties may be selected from among chromophores, catalysts, and electroactive molecules. More specifically, active moieties may be selected from among a ruthenium coordination complex, an osmium coordination complex, a copper coordination complex, a porphyrin, a phthalocyanine, an organic dye, and combinations thereof.

Chromophores include any suitable species that harvest light to achieve an excited state. Metal-centered dye molecules appear in some embodiments. Certain additional embodiments provide assemblies or multilayer films in which any one of the active moieties is chosen from ruthenium coordination complexes, osmium coordination complexes, copper coordination complexes, porphyrins, phthalocyanines, and organic dyes, and combinations thereof. Examples include N719, N3, D131, MK-2, C101, Black Dye (N749), C106, K19, Z907, Squarylium dye III, Coumarin (6, 30, 102, 153, 343), D102, D149, D205, D358, Merocyanine 540, porphyrins, phthalocyanines, SQ2, BA741, RK1, BA504, D-π-A dyes, PDI, etc.

Catalysts useful in the present invention include any suitable catalyst. Suitable catalysts include, but are not limited to, single site water oxidation catalysts, multisite water oxidation catalysts, proton reduction catalysts, $CO_2$ reduction catalysts, hydrocarbon oxidation, and combinations thereof. Suitable single site water oxidation catalysts, in some cases, comprise an atom of Ru, Co, Ir, Fe, or a combination thereof, when more than one such catalyst is present. In certain cases, the single site water oxidation catalyst is $[Ru(2,6-bis(1-methylbenzimidazol-2-yl)pyridine)(4,4'-(CH_2PO_3H_2)_2-bpy)(OH_2)]^{2+}$ or a deprotonated derivative thereof.

Catalysts useful in the present invention include any suitable catalysts. Suitable catalysts include, but are not limited to, single site water oxidation catalysts, multisite water oxidation catalysts, proton reduction catalysts, and combinations thereof. An example of a multisite water oxidation catalyst is the two-metal centered compound having the following structure:

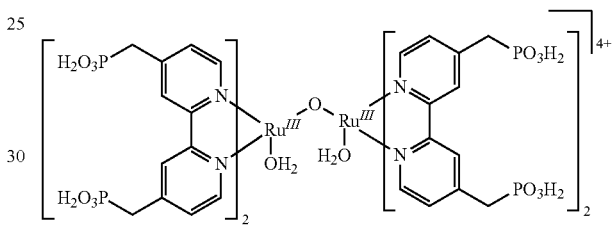

Deprotonated derivatives thereof also are contemplated. The foregoing compound can be synthesized analogously to the two-metal centered compound disclosed in S. W. Gersten, G. J. Samuels, and T. J. Meyer, *J. Am. Chem. Soc.* 1982, 104, 4029-4030. Phosphonation at the 4,4' positions of the bpy ligands can be accomplished as reported in I. Gillaizeau-Gauthier, F. Odobel, M. Alebbi, R. Argazzi, E. Costa, C. A. Bignozzi, P. Qu and G. J. Meyer, *Inorg. Chem.*, 2001, 40, 6073-6079. Some embodiments employ oxidation catalysts, which facilitate the oxidation of species in reactive communication with the catalyst. Other embodiments employ reduction catalysts, which facilitate the reduction of species in reactive communication with the catalyst. Catalysts suitable for use in certain embodiments of the present invention appear disclosed in U.S. Patent Application Publication No. US 2011/0042227 A1, to Corbea et al.

Suitable single site water oxidation catalysts, in some cases, comprise an atom of Ru, Co, Ir, Fe, or a combination thereof, when more than one such catalyst is present. In certain cases, the single site water oxidation catalyst is $[Ru(2,6-bis(1-methylbenzimidazol-2-yl)pyridine)(4,4'-(CH_2PO_3H_2)_2-bpy)(OH_2)]^{2+}$ or a deprotonated derivative thereof.

Electroactive molecules that form part of the assemblies or thin films include any suitable electroactive molecule, which may include any species that can undergo electrochemical oxidation or reduction. Examples include functionalized ferrocene, cobalt polypyridine, etc.

More specific structures of active moieties, including chromophores, catalysts, and electroactive moieties, are provided below.

An embodiment of the present invention provides an active moiety such as

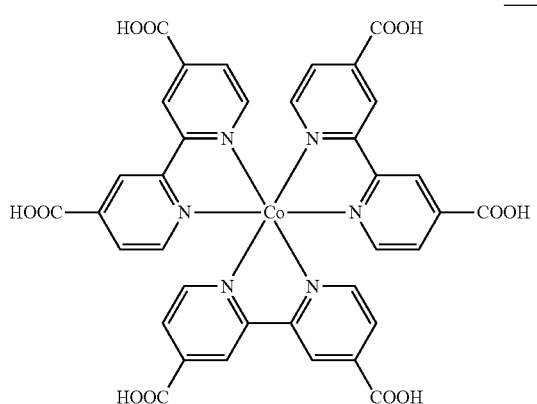
or a deprotonated derivative thereof, as a redox mediator.
Suitable ruthenium coordination complexes include, but are not limited to:
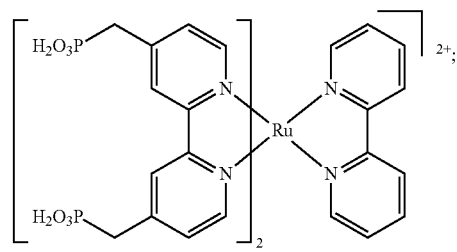
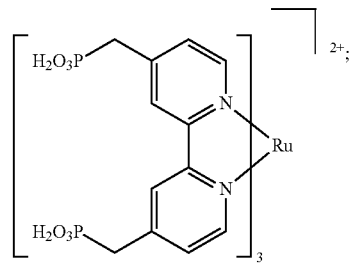
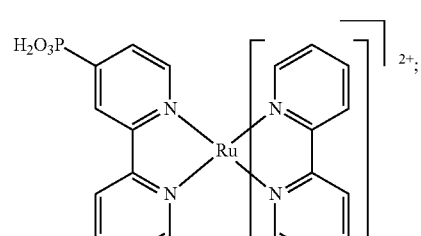
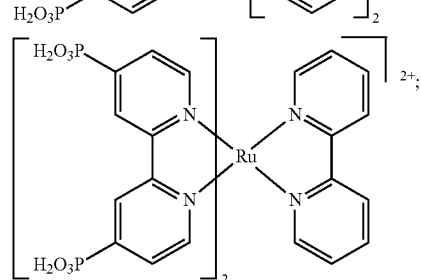
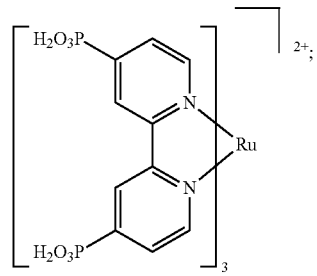
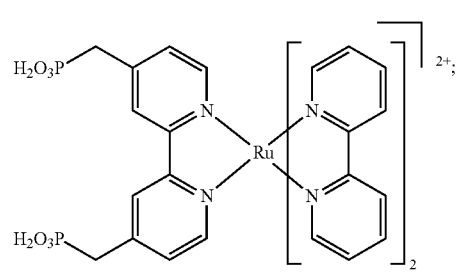
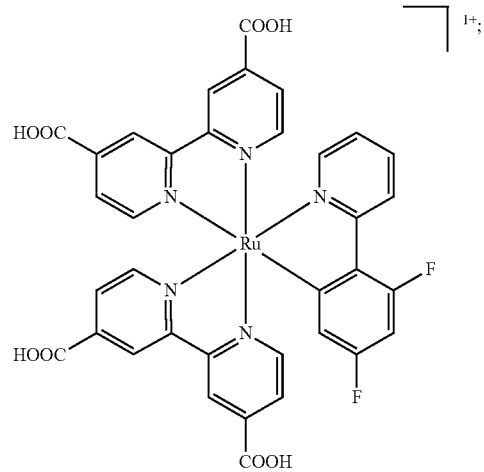
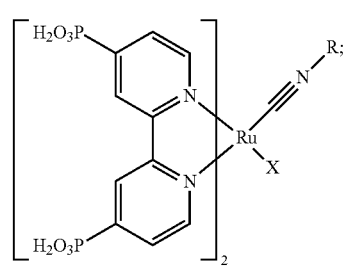
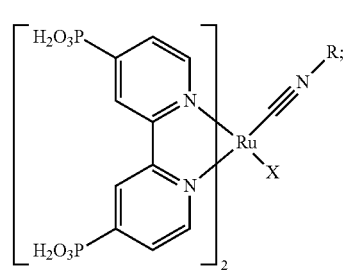

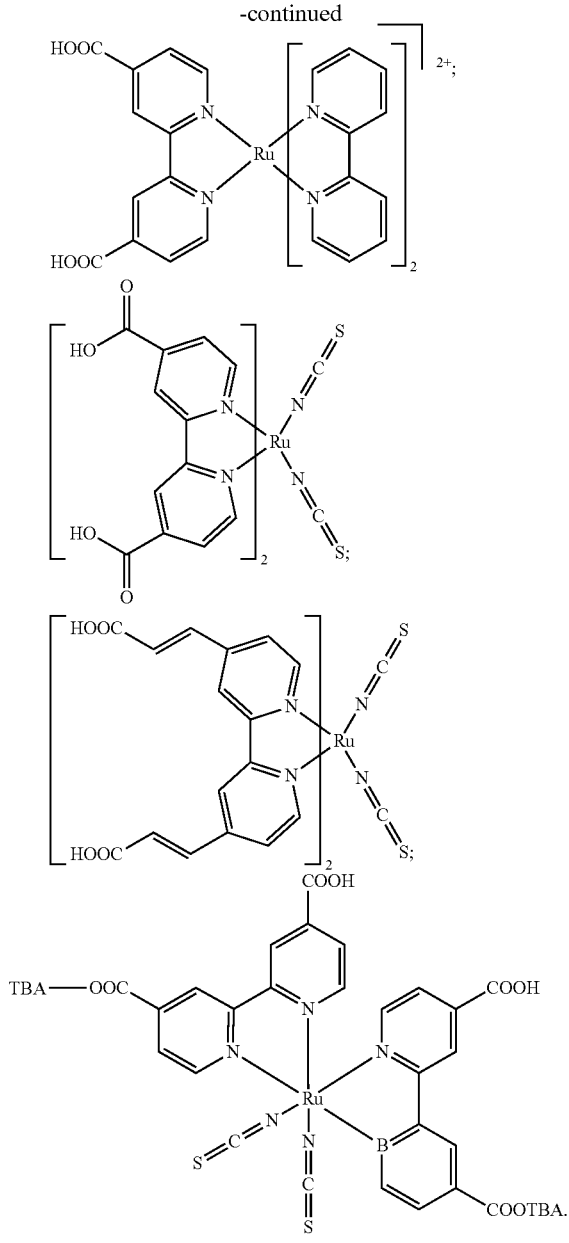

$(X)_2$bis(2,2'-bipyridyl-4,4'-dicarboxylate)ruthenium(II) compounds, wherein X is chosen from Cl, Br, I, CN, NC-Ph, —SCN, and —NCS; deprotonated derivatives of any of the foregoing; and combinations thereof.

Deprotonated derivatives of the molecules disclosed herein are those in which one or more hydrogen ions have been removed to form the conjugate base. It is believed, although not necessary for the practice of the present invention, that the conjugate base of certain surface linking groups and ion coordination groups represent the form of the molecule actually appearing in certain embodiments of the present invention. That is to say, the deprotonated form links to surface sites on the metal oxide, in some cases, while in other cases, the deprotonated form links to an ion joining two molecules together. One, two, three, four, five, six, or any suitable number of protons can be removed to form a deprotonated derivative. Methods for obtaining a deprotonated derivative are well known, such as, for example, by exposing the molecule to an increased pH, or by increasing the concentration of cations in solution.

Another embodiment of the present invention provides an active moiety such as

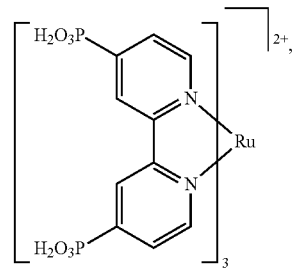

or a deprotonated derivative thereof.

Other embodiments provide an active moiety comprising

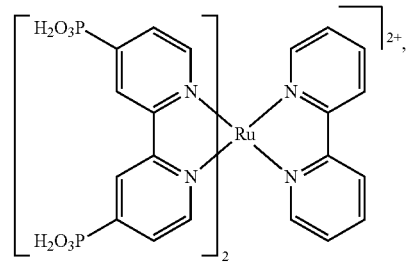

or a deprotonated derivative thereof.

Still other embodiments provide an active moiety comprising

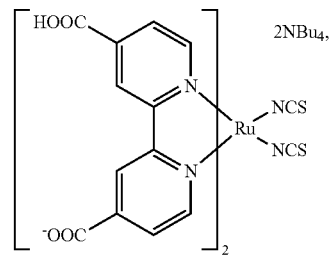

or a deprotonated derivative thereof.

Still additional embodiments provide an active moiety comprising

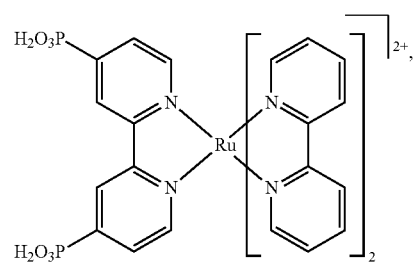

or a deprotonated derivative thereof.

Other embodiments employ, as an active moiety,

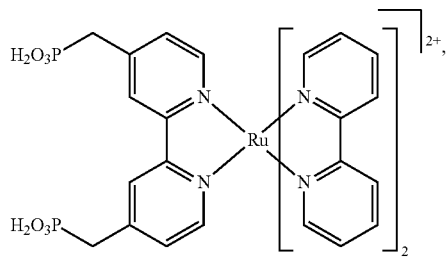

or a deprotonated derivative thereof.

Still further embodiments provide an active moiety comprising [Ru(2,6-bis(1-methylbenzimidazol-2-yl)pyridine)(4,4'-(CH$_2$PO$_3$H$_2$)$_2$-bpy)(OH$_2$)]$^{2+}$ or a deprotonated derivative thereof.

Some embodiments of the present invention employ osmium coordination complexes chosen from:

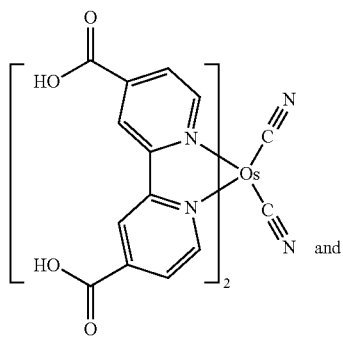

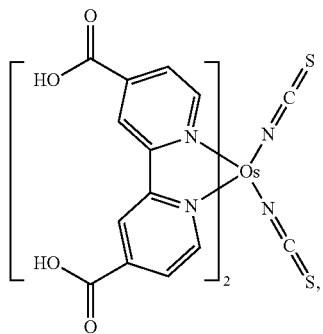

deprotonated derivatives thereof, and combinations thereof.

Other embodiments provide copper coordination complexes that are chosen from:

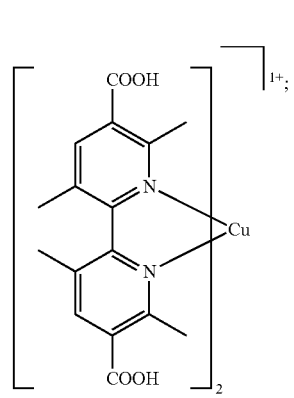

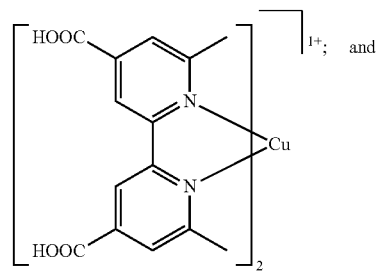

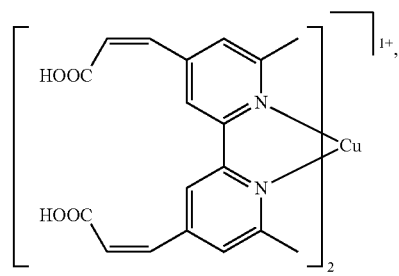

deprotonated derivatives thereof, and combinations thereof.

Still other embodiments employ porphyrins chosen from metal-coordination complexes comprising one of the following ligands:

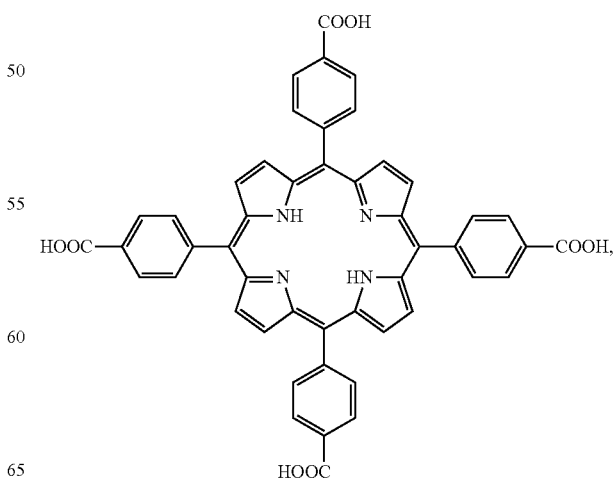

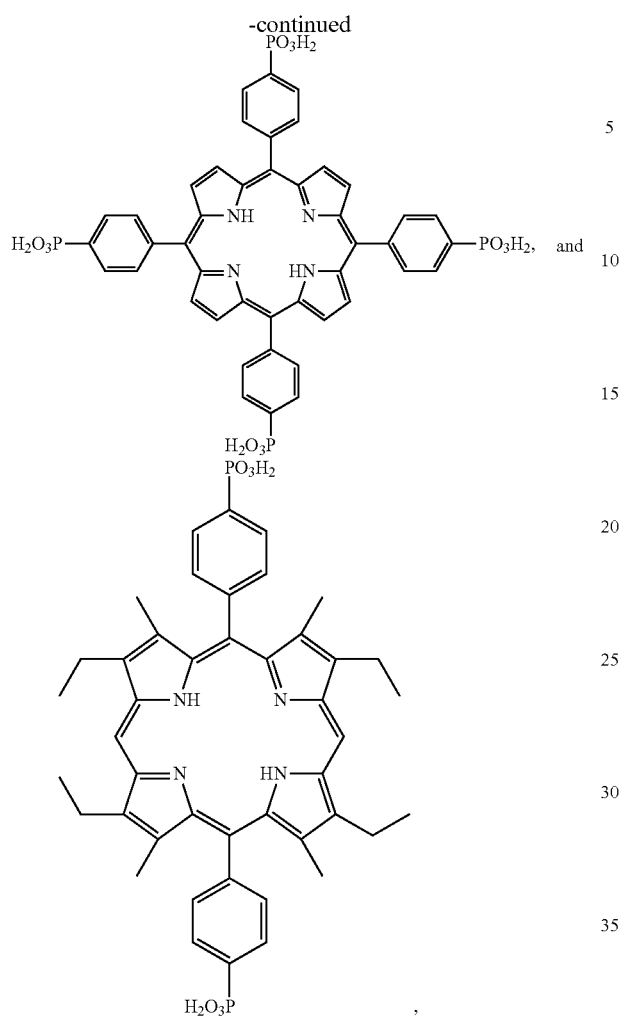
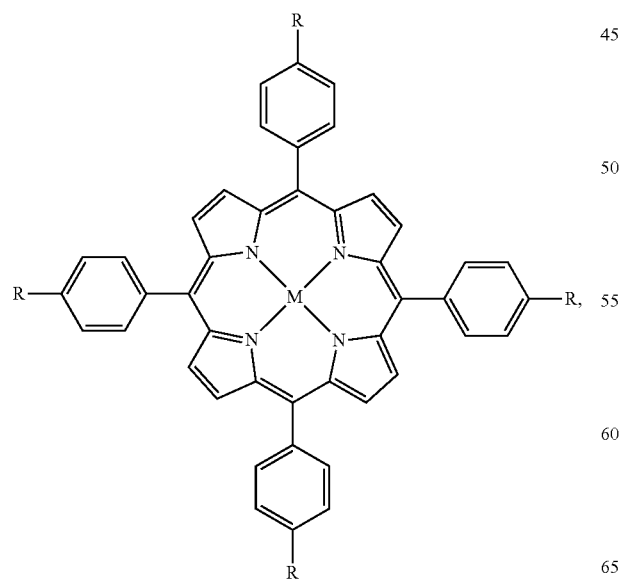
and deprotonated derivatives thereof.
In some cases, the porphyrin is
and M is Ni, Zn, Pd, Pb, Pt, or Ru, and R is chosen from —COOH, —PO$_3$H$_2$, or a deprotonated derivative thereof, or a combination of two or more of the foregoing.
In some cases, the porphyrin is:
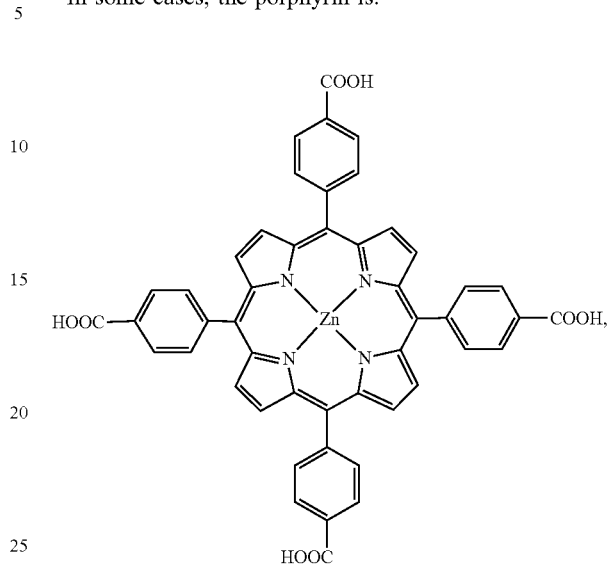
or a deprotonated derivative thereof.
Suitable phthalocyanines include, but are not limited to:
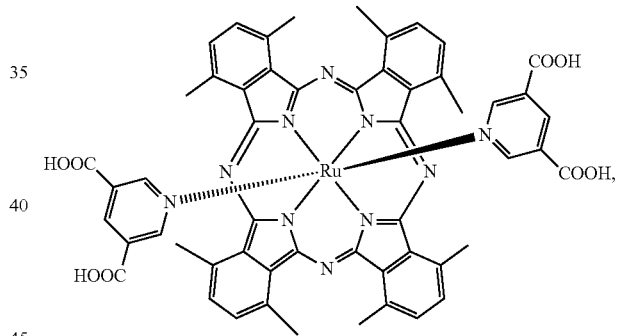
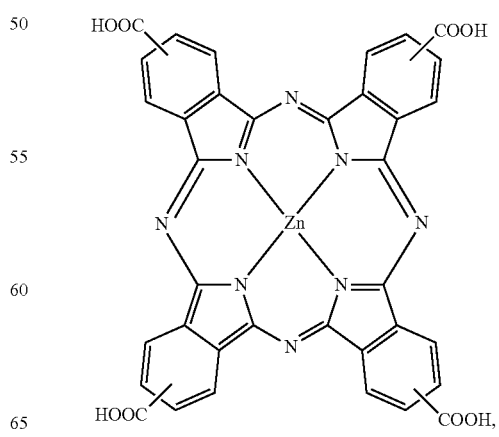

-continued

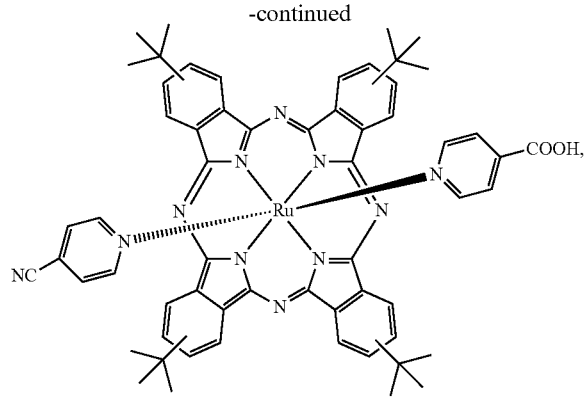

deprotonated derivatives thereof, and combinations thereof.

Organic dyes suitable for use in some embodiments of the present invention are chosen from:

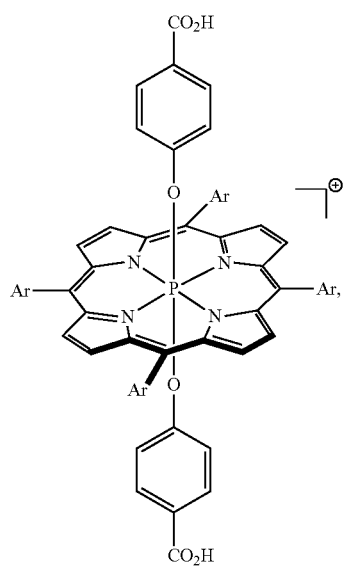

wherein Ar is 3,5-di-tertbutylphenyl;

wherein X is halide, —CN, —CF$_3$, —CH$_3$, -Ph(CF$_3$)$_2$, Ph, Ph(CH$_3$)$_2$, or a combination thereof; deprotonated derivatives thereof and combinations thereof. As used herein, "Ph" relates to the phenyl group, C$_6$H$_5$—. Substituents can appear at any suitable position about the phenyl ring. When more than one substituent appears, they can be positioned in any suitable manner about the phenyl ring. In some cases, two substituents appear ortho, para to the carbon linking the phenyl ring to the rest of the molecule. In other cases, two substituents appear meta, meta to the linking carbon. In still other cases, two substituents appear in any suitable combination of ortho, meta, and/or para. Syntheses of many of the active moieties are known, and some are commercially available. Chemical modification of molecules, or of precursors thereof, to add the surface linking groups and ion coordination groups, is also known or can be obtained by analogy to known modifications.

In some preferred embodiments, the active moiety comprises a chromophore selected from the group consisting of:

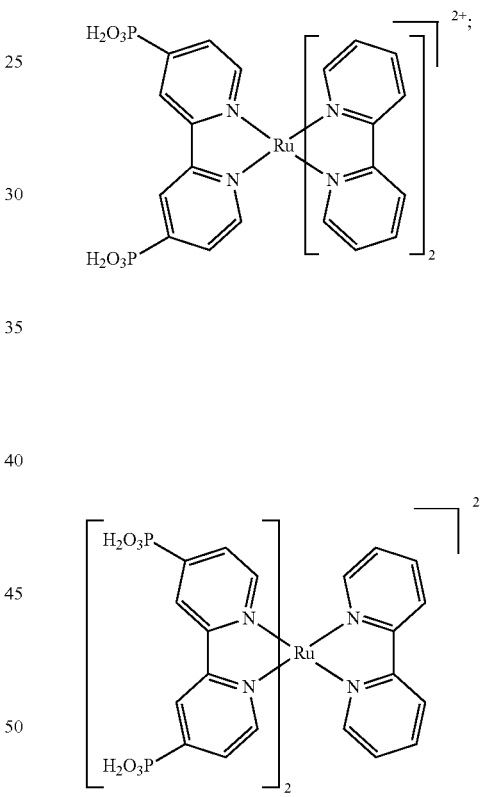

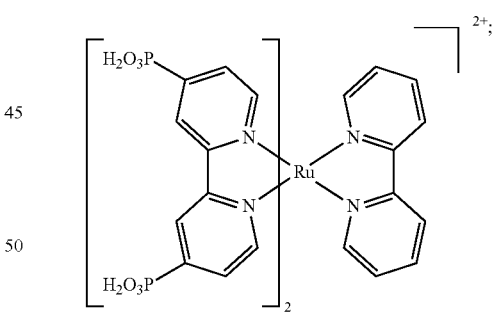

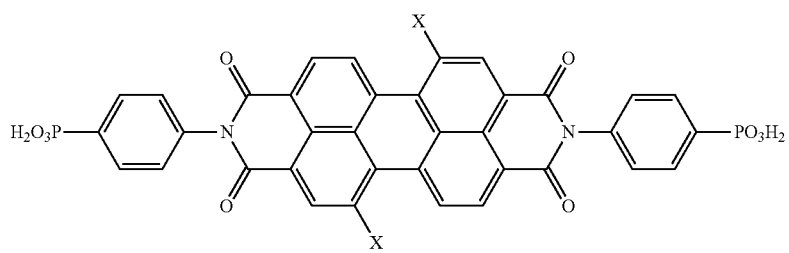

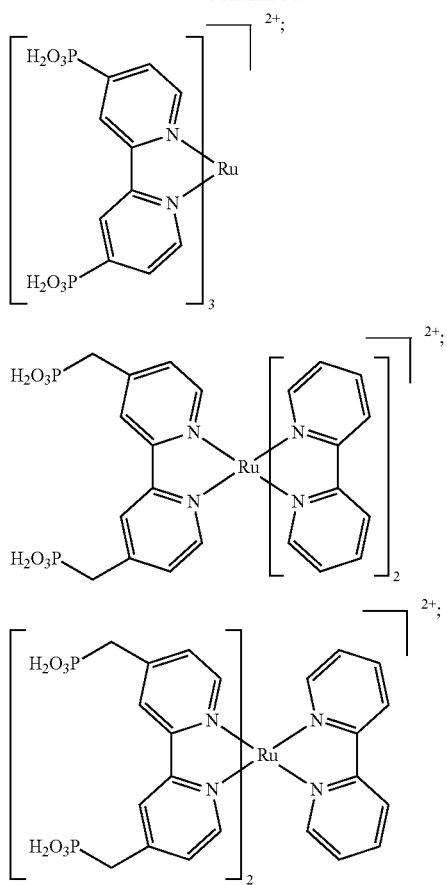

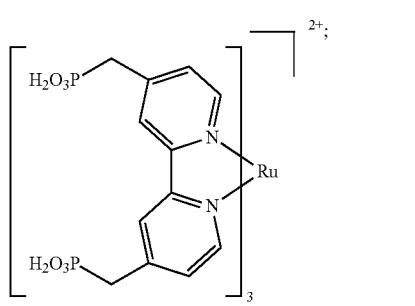

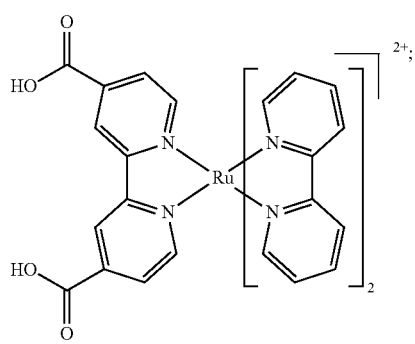

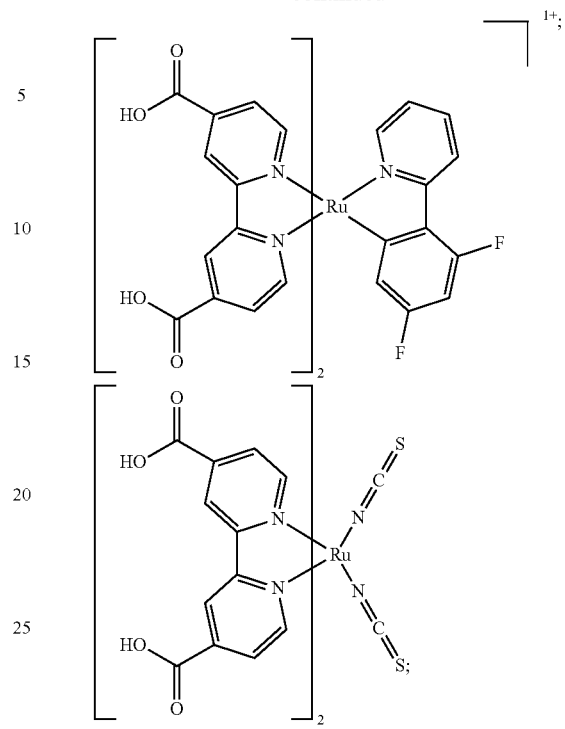

deprotonated derivatives of any of the foregoing; and combinations thereof.

In some preferred embodiments, the active moiety comprises a ruthenium coordination complex having the formula $(X)_2$bis(2,2'-bipyridyl-4,4'-dicarboxylate)ruthemium (II), wherein X is selected from the group consisting of Cl, Br, I, CN, NC-Ph, and SCN, and deprotonated derivatives thereof.

Other active moieties can be selected and synthesized in accordance with the guidance provided herein.

In some embodiments, and according to current understanding and theory of the invention to date, the multilayer structure of the invention may have the following general structure (I):

Metal Oxide Surface-$(L_1)$-$(A)$-$(L_2)$-$(MC)$-$(L_3)$-Active Moiety (I)

In the context of structure (I), $L_1$, $L_2$, and $L_3$ are each independently a linking group, e.g., a surface linking group, as defined above. In some embodiments, $L_1$, $L_2$, and $L_3$ are each a metal ion chelating moiety or a metal bonding moiety selected from the group consisting of —COOH, —PO$_3$H$_2$, —SO$_3$H, —OPO$_3$H, —OSO$_3$H, —SiO$_3$, -Ph(OH)$_2$, —CH(CO$_2$H)$_2$, —CH=C(CN)CO$_2$H, —CH=C(CO$_2$H)$_2$, —CONHOH, —CSSH, —CSOH, and any combination thereof.

In the context of structure (I), A is one or more bridging moieties selected from the group consisting of alkyl, alkenyl, alkynyl, aromatic, heterocyclic, cycloalkyl, and combinations thereof, as defined above. In some embodiments, the bridging moiety, A, may comprise one or more than one of alkyl, alkenyl, alkynyl, aromatic, heteroaromatic, heterocycloalkyl, and cycloalkyl, for example, one of such groups, two, three, four, or more such groups. In some embodiments, in which A comprises multiple alkyl, alkenyl, alkynyl, aromatic, heteroaromatic, heterocycloalkyl, or cycloalkyl, all groups may be identical. In some embodiments, in which A comprises multiple alkyl, alkenyl, alkynyl, aromatic, heteroaromatic, heterocycloalkyl, or cycloalkyl, some of the groups may be different from each other. In some embodiments, the bridging moiety, A, may be substituted with, e.g., halo (Cl, Br, F, or I), haloalkyl, cyano, amino (including primary, secondary, tertiary alkyl amines), and so on.

In the context of structure (I), MC is a linking coordinating metal ion selected from the group consisting of $Cu^{2+}$, $Co^{2+}$, $Ni^{2-}$, $Zn^{2+}$, $Mn^{2+}$, $Fe^{2+}$, $Sr^{2+}$, $Al^{3+}$, $V^{3+}$, $In^{3+}$, $Fe^{3+}$, $Gd^{3+}$, $Y^{3+}$, $Yb^{3+}$, $Nd^{3+}$, $Ce^{3-}$, $La^{3+}$, $Sc^{3+}$, $Dy3+$, $Zr^{4+}$, $Ti^{4+}$, $Sn^{4+}$, and combinations thereof.

In some preferred embodiments, and according to current understanding and theory of the invention to date, the multilayer structure of the invention has the following general structure (II):

(II)

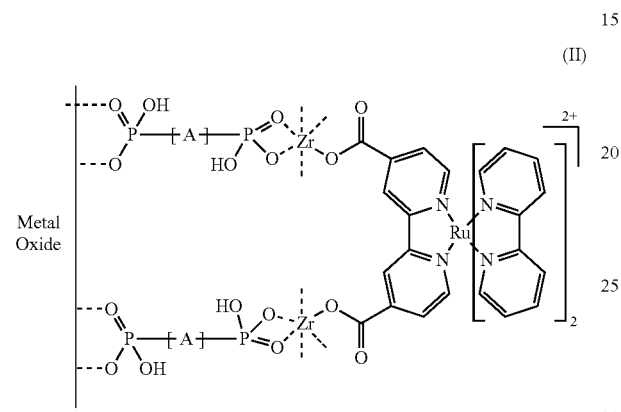

In the context of structure (II), A is one or more bridging moieties selected from the group consisting of alkyl, alkenyl, alkynyl, aromatic, heterocyclic and cycloalkyl, as defined above. In some embodiments, the bridging moiety, A, may comprise one or more than one of alkyl, alkenyl, alkynyl, aromatic, heteroaromatic, heterocycloalkyl, and cycloalkyl, for example, one of such groups, two, three, four, or more such groups. In some embodiments, in which A comprises multiple alkyl, alkenyl, alkynyl, aromatic, heteroaromatic, heterocycloalkyl, or cycloalkyl, all groups may be identical. In some embodiments, in which A comprises multiple alkyl, alkenyl, alkynyl, aromatic, heteroaromatic, heterocycloalkyl, or cycloalkyl, some of the groups may be different from each other. In some embodiments, the bridging moiety, A, may be substituted with, e.g., halo (Cl, Br, F, or I), haloalkyl, cyano, amino (including primary, secondary, tertiary alkyl amines), and so on.

In some preferred embodiments of structure (II), the bridging moiety, A, may comprise one or more selected from among the following:

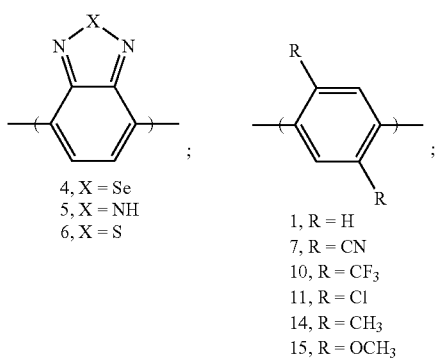

4, X = Se
5, X = NH
6, X = S

1, R = H
7, R = CN
10, R = $CF_3$
11, R = Cl
14, R = $CH_3$
15, R = $OCH_3$

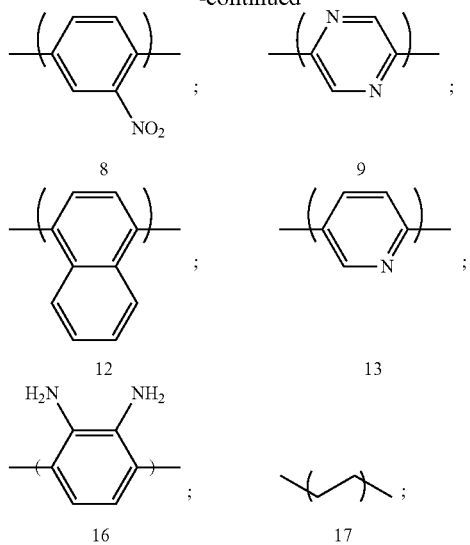

8
9
12
13
16
17 and combinations thereof.

In some preferred embodiments, and according to current understanding and theory of the invention to date, the multilayer structure of the invention has the following general structure (III):

(III)

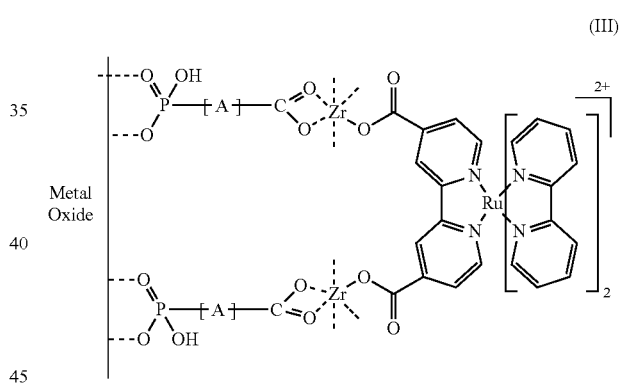

In the context of structure (III), A is one or more bridging moieties selected from the group consisting of alkyl, alkenyl, alkynyl, aromatic, heterocyclic and cycloalkyl, as defined above. In some embodiments, the bridging moiety, A, may comprise one or more than one of alkyl, alkenyl, alkynyl, aromatic, heteroaromatic, heterocycloalkyl, and cycloalkyl, for example, one of such groups, two, three, four, or more such groups. In some embodiments, in which A comprises multiple alkyl, alkenyl, alkynyl, aromatic, heteroaromatic, heterocycloalkyl, or cycloalkyl, all groups may be identical. In some embodiments, in which A comprises multiple alkyl, alkenyl, alkynyl, aromatic, heteroaromatic, heterocycloalkyl, or cycloalkyl, some of the groups may be different from each other. In some embodiments, the bridging moiety, A, may be substituted with, e.g., halo (Cl, Br, F, or I), haloalkyl, cyano, amino (including primary, secondary, tertiary alkyl amines), and so on.

In some preferred embodiments of structure (III), the bridging moiety, A, may comprise one or more selected from among the following:

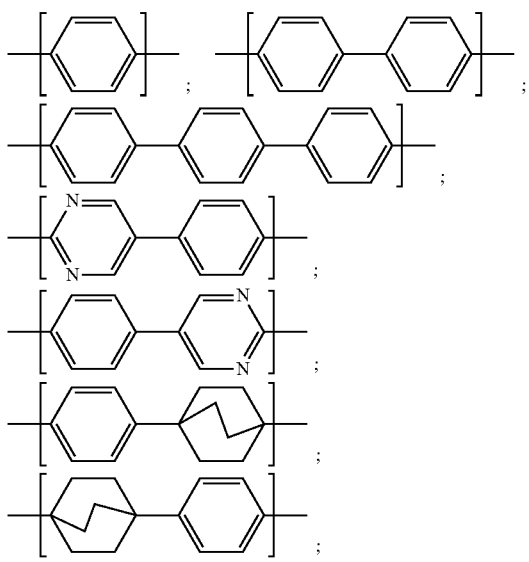

and combinations thereof.

In some preferred embodiments, and according to current understanding and theory of the invention to date, the multilayer structure of the invention has the following general structure (IV):

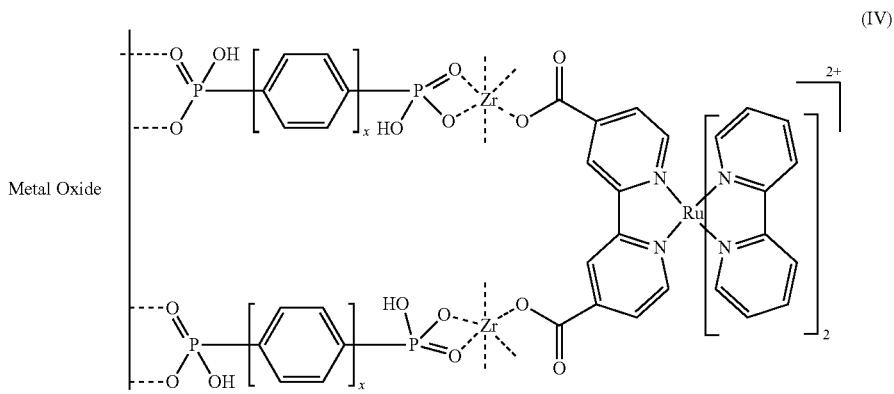

(IV)

wherein X is a number between one and five, preferably one, two, or three.

Multilayer structures according to the present invention may find use as an electrode, in a dye-sensitized solar cell, or a dye-sensitized photoelectrochemical cell, among other uses.

Additional embodiments provide an electrode. Such an electrode can comprise at least one assembly for harvesting light, in some embodiments. Such an electrode can comprise a multilayer film for harvesting light, in other embodiments. Electrodes can comprise any suitable substrate for the assembly. In some cases, a substrate comprises a metal, such as, for example, copper, nickel, gold, silver, platinum, steel, glassy carbon, silicon, and alloys comprising one or more thereof. In other cases, the substrate is transparent or semi-transparent to allow light to pass through the substrate to allow the assembly to harvest such light. Fluorine-doped tin oxide coated on glass, or indium-doped tin oxide on glass can be used in such cases.

Further embodiments provide a dye-sensitized solar cell. Such a cell can comprise at least one chromophore for harvesting light, in some embodiments. Suitable electrolyte compositions include those containing a desired redox mediator in a suitable solvent, for example. Suitable counter electrodes, cell arrangements, and other components of such dye-sensitized solar cells are known.

Still further embodiments provide a dye-sensitized photoelectrochemical cell. Such a cell can comprise at least one molecule for harvesting light and one catalyst assembled on the bridging molecule and metal ion. Suitable counter electrodes, cell arrangements, and other components of such dye-sensitized photoelectrochemical cells are known.

In some embodiments, the present invention is directed to a method of preparing a self-assembled multilayer film on a substrate comprising a metal oxide surface and a bulk region.

In some embodiments, the method comprises contacting the metal oxide surface with a bridging molecule having the general structure $(L_1)$-$(A)$-$(L_2)$ to thereby form a covalently bonded self-assembled monolayer on the surface of the metal oxide. In the context of this method, $L_1$ and $L_2$, are each independently a surface linking group, as disclosed above. In the context of this method, A comprises a bridging moiety.

In the context of this method, the metal oxide surface is chosen from $SiO_2$, $SnO_2$, $TiO_2$, $Nb_2O_5$, $SrTiO_3$, $ZnO$, $Zn_2SnO_4$, $ZrO_2$, $NiO$, Ta-doped $TiO_2$, Nb-doped $TiO_2$, and combinations of two or more thereof. In other embodiments, the metal oxide comprises $TiO_2$, such as nanocrystalline $TiO_2$. In further embodiments, the metal oxide comprises $NiO$. In still other embodiments, the surface comprises $ZrO_2$, such as nanoparticles of $ZrO_2$. In some embodiments, the entire substrate comprises the metal oxide material. In some embodiments, the metal oxide surface is a layer coating a different bulk region material. For example, core-shell nanostructures are also possible. In some embodiments, a core-shell nanostructure may comprise one or more of: ZnO-coated $SnO_2$, MgO-coated $SnO_2$, $Al_2O_3$-coated $SnO_2$, $TiO_2$-coated In-doped $SnO_2$, and $TiO_2$-coated F-doped $SnO_2$. In some embodiments, the metal oxide surfaces provide a conducting surface. In some embodiments, the metal oxide surfaces provide a semiconducting surface. In some embodiments, the metal oxide surface provides an insulating surface. Methods of making various metal oxide materials are known to those of ordinary skill in the art.

In the context of this method, $L_1$ and $L_2$, are each independently a surface linking group, as disclosed above. In some embodiments, the surface linking group is capable of both chelating metal ions and covalently bonding to metals and/or metal ions. In some embodiments, the surface linking group is selected from among —COOH, —PO$_3$H$_2$, —SO$_3$H, —OPO$_3$H, —OSO$_3$H, —SiO$_3$, -Ph(OH)$_2$, —CH(CO$_2$H)$_2$, —CH=C(CN)CO$_2$H, —CH=C(CO$_2$H)$_2$, —CONHOH, —CSSH, —CSOH, and combinations thereof In some embodiments, the bridging molecule comprises two or more surface linking groups, such as 2, 3, 4, 5 or more surface linking groups. In the context of structures of the invention, the surface linking groups, L, may be designated numerically, e.g., L$_1$, L$_2$, L$_3$, L$_4$, L$_5$, etc.

In the context of this method, the bridging moiety, A, is one or more moiety selected from the group consisting of alkyl, alkenyl, alkynyl, aromatic, heteroaromatic, heterocycloalkyl, cycloalkyl, and combinations thereof. In some embodiments, the bridging moiety, A, may comprise one or more than one of alkyl, alkenyl, alkynyl, aromatic, heteroaromatic, heterocycloalkyl, and cycloalkyl, for example, one of such groups, two, three, four, or more such groups. In some embodiments, in which A comprises multiple alkyl, alkenyl, alkynyl, aromatic, heteroaromatic, heterocycloalkyl, or cycloalkyl, all groups may be identical. In some embodiments, in which A comprises multiple alkyl, alkenyl, alkynyl, aromatic, heteroaromatic, heterocycloalkyl, or cycloalkyl, some of the groups may be different from each other. In some embodiments, the bridging moiety, A, may be substituted with, e.g., halo (Cl, Br, F, or I), haloalkyl, cyano, amino (including primary, secondary, tertiary alkyl amines), and so on.

In some preferred embodiments, the metal oxide surface is contacted with a bridging molecule selected from among the following:

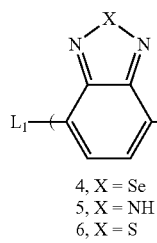

4, X = Se
5, X = NH
6, X = S

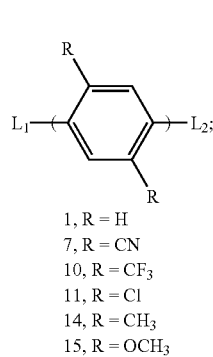

1, R = H
7, R = CN
10, R = CF$_3$
11, R = Cl
14, R = CH$_3$
15, R = OCH$_3$

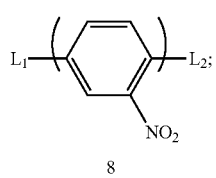

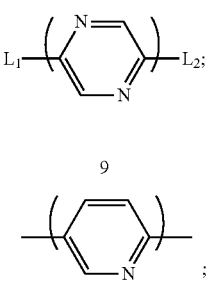

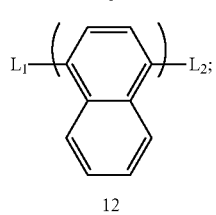

8

9

12

13

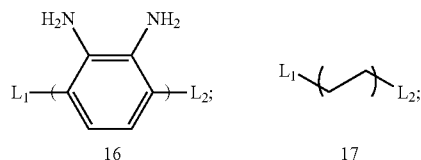

16

17 and combinations thereof.

In some preferred embodiments, the metal oxide surface is contacted with a bridging molecule selected from among the following:

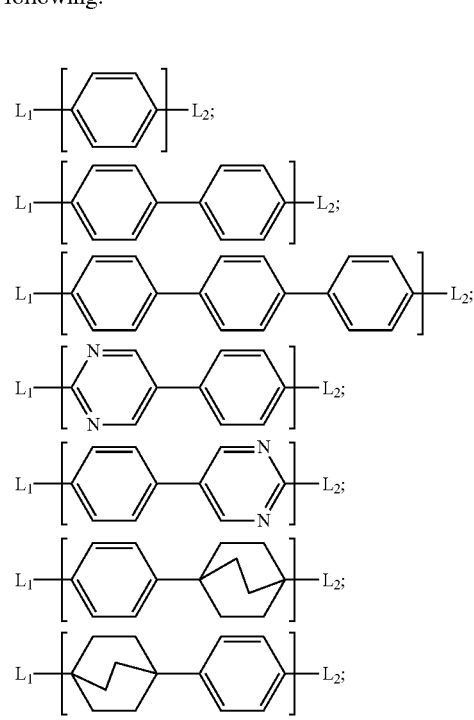

and combinations thereof.

According to the method of the present invention, the self-assembled monolayer covalently bonded to the surface of the metal oxide via the surface linkage is next contacted with a metal ion selected from the group consisting of Cu$^{2+}$, Co$^{2+}$, Ni$^{2+}$, Zn$^{2+}$, Mn$^2$, Fe$^{2+}$, Sr$^{2+}$, Al$^{3+}$, V$^{3+}$, In$^{3+}$, Fe$^{3+}$, Gd$^{3+}$, Y$^{3+}$, Yb$^{3+}$, Nd$^{3+}$, Ce$^{3+}$, La$^{3+}$, Sc$^{3+}$, Dy$^3$, Zr$^{4+}$, Ti$^{4+}$, Sn$^{4+}$, and combinations thereof, to thereby incorporate a coordinating metal into the self-assembled monolayer on the surface of the metal oxide. The metal ion may be provided in the form of a common water soluble salt comprising any common anion, e.g., chloride, bromide, iodide, sulfate, hydrogen sulfate, chlorate, carbonate, acetate, thiocyanate, etc.

Finally, according to the method of the present invention, the linking coordinating metal ion in the self-assembled monolayer on the surface of the metal oxide is next contacted with an active moiety selected from the group consisting of a chromophore, a catalyst, and an electroactive molecule bonded to the linking coordinating metal ion, to thereby bond the active moiety to the linking coordinating metal. The active moieties are provided in extensive detail above in this disclosure.

EXAMPLES

The following non-limiting examples are provided to further illustrate the present invention.

Experiment Section 1.

Materials

Zirconyl chloride octahydrate, $LiClO_4$ were used as received from Sigma-Aldrich. RuC and 1, 2, and 3 were prepared according to literature procedure. See (1) Gillaizeau-Gauthier, I.; Odobel, F.; Alebbi, M.; Argazzi, R.; Costa, E.; Bignozzi, C. A.; Qu, P.; Meyer, G. J. *Inorganic Chemistry* 2001, 40, 6073. (2) Henn, M.; Deáky, V.; Krabbe, S.; Schürmann, M.; Prosenc, Marc H.; Herres-Pawlis, S.; Mahieu, B.; Jurkschat, K. *Zeitschrift für anorganische und allgemeine Chemie* 2011, 637, 211. (3) Prochniak, G.; Zon, J.; Daszkiewicz, M.; Pietraszko, A.; Videnova-Adrabinska, V. *Acta Crystallographica Section C* 2007, 63, o434. (4) Lo, C.-Y.; Chen, C.-H.; Tsai, T. W. T.; Zhang, L.; Lim, T.-S.; Fann, W.; Chan, J. C. C.; Luh, T.-Y. *Journal of the Chinese Chemical Society* 2010, 57, 539. Fluorine-doped tin oxide (FTO) coated glass (Hartford Glass Co.; sheet resistance 15 $\Omega cm^{-2}$), was cut into 11 mm×50 mm strips and used as the substrate for $TiO_2$ and $ZrO_2$ nanoparticle films.

Thin Films.

Nano-$TiO_2$ and nano-$ZrO_2$ films, ~4 μm thick, coating an area of 11 mm×25 mm on top of FTO glass were prepared by doctor blading (1 layer of scotch tape) according to previously published procedures. See (5) Lee, S.-H. A.; Abrams, N. M.; Hoertz, P. G.; Barber, G. D.; Halaoui, L. I.; Mallouk, T. E. *The Journal of Physical Chemistry B* 2008, 112, 14415. (6) O'Regan, B.; Moser, J.; Anderson, M.; Graetzel, M. *The Journal of Physical Chemistry* 1990, 94, 8720. (7) Heimer, T. A.; D'Arcangelis, S. T.; Farzad, F.; Stipkala, J. M.; Meyer, G. J. *Inorganic Chemistry* 1996, 35, 5319. (8) Song, W.; Glasson, C. R. K.; Luo, H.; Hanson, K.; Brennaman, M. K.; Concepcion, J. J.; Meyer, T. J. *The Journal of Physical Chemistry Letters* 2011, 2, 1808.

Preparation of Multilayer Films.

Figure 3:
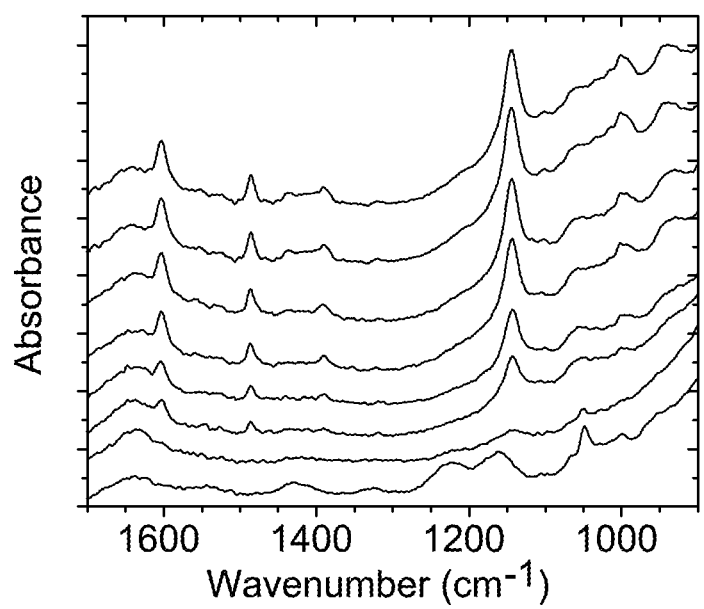
FIG. 3 are ATR-IR absorption spectra of $TiO_2$ submerged in various concentrations of 3 (see FIG. 2A) in DMSO overnight. Concentrations increased from bottom to top in the plot (0 μM, 10 μM, 20 μM, 50 μM, 100 μM, 150 μM, 200 μM, 500 μM 3 in DMSO).

Adsorption isotherm of the spacer molecules on $TiO_2$ were measured by immersing the thin films in 3 mL DMSO solution of 1-3 (See FIG. 2A) with concentrations of 10, 20, 50, 100, 150, 200 and 500 μM (see FIG. 3, absorbance spectra from bottom to top correlate with increasing concentrations). The slides were removed, rinsed with acetonitrile and dried under a stream of nitrogen. The ATR-IR absorption spectra of the resulting films can be seen in FIG. 3 for molecule 3, as an example. The highest surface loadings were achieved in >150 μM solutions of bridging molecules 1, 2 and 3. Loading was further increased by positioning the films vertically in 3 mL of 150 μM spacer in DMSO followed by slow evaporation of solvent at 170° C. over the course of 12 hours. See (9) Danahy, M. P.; Avaltroni, M. J.; Midwood, K. S.; Schwarzbauer, J. E.; Schwartz, J. *Langmuir* 2004, 20, 5333. Upon completion, the slides were removed from solution, rinsed with acetonitrile and dried under a stream of nitrogen.

Zirconium treatments were performed by immersing the $TiO_2$—(X) (X=1, 2, and 3) films in a 0.1M $HClO_4$ aqueous solution of 500 μM $ZrOCl_2$. All ATR-IR spectral changes were complete in the first 20 minutes. However, all samples for subsequent measurements were soaked in $ZrOCl_2$ solutions for two hours to ensure complete $Zr^{4+}$ loading.

Chromophore loading was achieved by soaking the $ZrO_2$ and $TiO_2$ films in a 200 μM RuC in MeOH overnight follow by subsequent rinsing of MeOH to remove any unbound dye.

Photophysical Characterization.

Absorption spectroscopy. The UV-visible spectra were recorded using an Agilent 8453 UV-Visible photo diode array spectrophotometer by placing the dry derivatized $TiO_2$/FTO slides perpendicular to the detection beam path.

Transient absorption (TA) measurements were carried out by inserting derivatized thin films at a 45° angle into a 10 mm path length square cuvette that has an o-ring seal with a Kontese valve inlet to allow the contents to be purged with nitrogen. TA experiments were performed by using nanosecond laser pulses produced by a Spectra-Physics Quanta-Ray Lab-170 Nd:YAG laser combined with a VersaScan OPO (532 nm, 5-7 ns, operated at 1 Hz, beam diameter 0.5 cm, 2.5 to 5 mJ/pulse) integrated into a commercially available Edinburgh LP920 laser flash photolysis spectrometer system. White light probe pulses generated by a pulsed 450 W Xe lamp were passed through the sample, focused into the spectrometer (3 nm bandwidth), then detected by a photomultiplier tube (Hamamatsu R928). A 532 nm notch filter was placed before the detector to reject unwanted scattered light. Detector outputs were processed using a Tektronix TDS3032C Digital Phosphor Oscilloscope interfaced to a PC running Edinburgh's L900 (version 7.0) software package. Single wavelength kinetic data were the result of averaging 100 laser shots and were fit using either Origin or Edinburgh software. The data were fit over the first 10 μs by using the tri-exponential function in equation 1 and the weighted average lifetime ($<\tau>$) calculated from equation 2. The results of multiple measurements revealed variations in the kinetic fit parameters of <5% with general trends reproduced in three separate trials.

$$y = A_1 e^{-k1x} + A_2 e^{-k2x} + A_3 e^{-k3x} \qquad (eq\ 1)$$

$$\tau_i = 1/k_i;\ <\tau> = \Sigma A_i \tau_i^2 / \Sigma A_i \tau_i \qquad (eq\ 2)$$

Steady-State and Time-Resolved Emission data were collected at room temperature using an Edinburgh FLS980 spectrometer. Metal oxide samples were placed in a two piece cuvette and Argon degassed as described for the TA measurements. Samples were excited using light output from a housed 450 W Xe lamp passed through a single grating (1800 l/mm, 250 nm blaze) Czerny-Turner monochromator and finally a 5 nm bandwidth slit. Emission from the sample was first passed through a 495 nm long-pass color filter, then a single grating (1800 l/mm, 500 nm blaze) Czerny-Turner monochromator (5 nm bandwidth) and finally detected by a peltier-cooled Hamamatsu R928 photomultiplier tube.

The dynamics of emission decay were monitored by using the FLS980's time-correlated single-photon counting capability (1024 channels; 5 μs window) with data collection for 10,000 counts. Excitation was provided by an Edinburgh EPL-445 picosecond pulsed diode laser (444.2 nm, 80 ps FWHM) operated at 200 kHz.

Time-resolved emission data were fit by using the biexponential function in equation 3. The results of multiple measurements revealed variations in the kinetic fit parameters of 5-10% with general trends reproduced in five separate trials. A weighted average of lifetime T is calculated by using equation 2.

$$y = A_1 e^{-k1x} + A_2 e^{-k2x} + y_0 \qquad (eq\ 3)$$

Emission quantum yields were acquired using an integrating sphere incorporated into a spectrofluorometer (FLS980, Edinburgh Instruments). The samples were prepared in a DSSC sandwich cell-type architecture. FTO glass was cut into 2×2 cm squares and an active area of 1 $cm^2$ metal oxide was prepared by doctor blading and dye loading as described above. A small hole (d=1 mm) was drilled into the corner of the 2×2 cm glass slide that did not have metal oxide. A 1 mm wide 2×2 cm Meltonix film (1170-25 from Solaronix) was placed between the two glass slides and the entire ensamble heated to ~150° C. for 7 seconds. After cooling to room temperature, 0.3M LiOCl$_4$ in MeCN was then injected through the 1 mm hole to fill the interior of the slides using a Vac'n Fill Syringe (65209 from Solaronix). The cell was then sealed with a meltonix film and micro glass cover slide (18×18 mm VWR) that covered the hole used for solvent injection. The final sandwich cell was then placed on the solid sample holder. TiO$_2$ and ZrO$_2$ cells without RuC were used as the reference for excitation scatter/absorption and emission.

Emission quantum yields were acquired following literature procedure with minor modification. See (10) McNeil, I. J.; Ashford, D. L.; Luo, H.; Fecko, C. J. *The Journal of Physical Chemistry C* 2012, 116, 15888. Because the emission intensity from quenched samples was low (<1%), we adopted a procedure described by Askes et al. See (11) Askes, S. H. C.; Bahreman, A.; Bonnet, S. *Angewandte Chemie International Edition* 2014, 53, 1029. In this procedure, absorption/scatter at the excitation wavelength and emission from the sample/reference were acquired under the same instrument settings ($\lambda_{ex}$=450 nm; 5 nm excitation slit; 0.3 nm emission slit; scan 430-470 nm for scatter/absorption; scan 500-850 nm for emission). However, the absorption/scatter scans were measured with a neutral density filter, with known absorption (OD=3; 0.1% transmittance), placed between the integrating sphere and the monochromator/detector. The filter was then removed for the emission scans. The integrated area for scatter/absorption was multiplied by 1000 to correct for the filter attenuation. Quantum yields were then calculated by using the Edinburg L980 software package.

$\Phi_{inj}$ were calculated from the emission quantum yields by using equation 11. Equation 11 is derived using equations 4-10 by assuming $k_r$ and $k_{nr}$ (non-injection decays) are the same on both TiO$_2$ and ZrO$_2$.

$$\Phi_{em}(ZrO_2)=k_r/(k_r+k_{nr})=k_r\tau \quad (eq\ 4)$$

$$\Phi_{em}(TiO_2)=k_r/(k_r+k_{nr}+k_{inj}) \quad (eq\ 5)$$

$$\Phi_{inj}(TiO_2)=k_{inj}/(k_r+k_{nr}+k_{inj}) \quad (eq\ 6)$$

$$\Phi_{em}(TiO_2)/\Phi_{em}(ZrO_2)=[k_r/(k_r+k_{nr}+k_{inj})]/[k_r/(k_r+k_{nr})]=(k_r+k_{nr})/(k_r+k_{nr}+k_{inj}) \quad (eq\ 7)$$

$$1-[\Phi_{em}(TiO_2)/\Phi_{em}(ZrO_2)]=1-[(k_r+k_n)/(k_r+k_{nr}+k_{inj})] \quad (eq\ 8)$$

$$1-[\Phi_{em}(TiO_2)/\Phi_{em}(ZrO_2)]=(k_r+k_{nr}+k_{inj})/(k_r+k_{nr}+k_{inj})-(k_r+k_{nr})/(k_r+k_{nr}+k_{inj}) \quad (eq\ 9)$$

$$1-[\Phi_{em}(TiO_2)/\Phi_{em}(ZrO_2)]=k_{inj}/(k_r+k_{nr}+k_{inj}) \quad (eq\ 10)$$

$$1-[\Phi_{em}(TiO_2)/\Phi_{em}(ZrO_2)]=\Phi_{inj}(TiO_2) \quad (eq\ 11)$$

Attenuated Total Reflectance Infrared Spectra were recorded using a Bruker Alpha FTIR spectrometer (SiC Glowbar source, DTGS detector) with a Platinum ATR quickSnap sampling module (single reflection diamond crystal). Spectra were acquired from 900 to 1700 cm$^{-1}$ at a resolution of 4 cm$^{-1}$. All ATR-IR spectra are reported in absorbance with a blank versus atmosphere.

Multilayer Film Formation.

Figure 4:
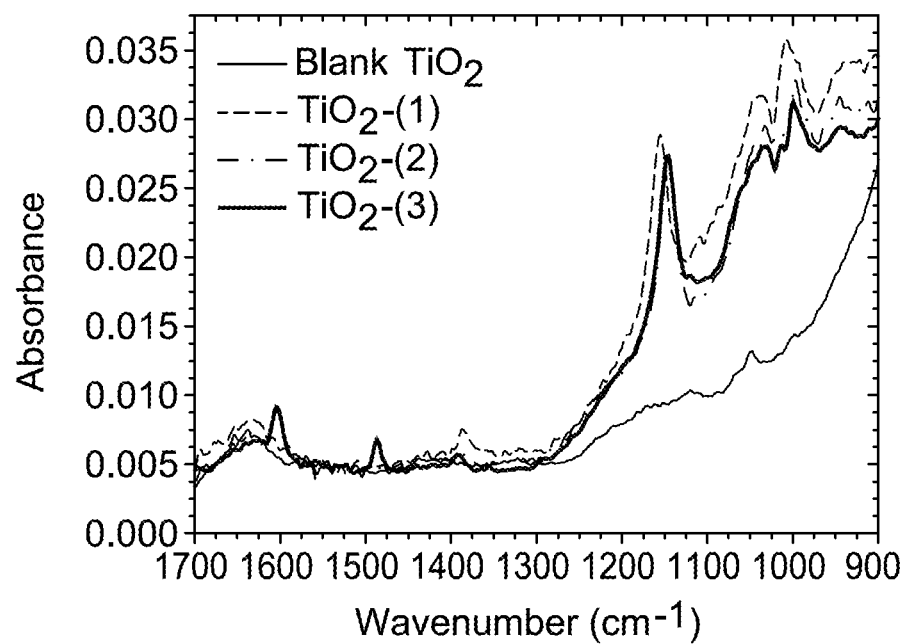
FIG. 4 are ATR-IR absorption spectra for $TiO_2$-(1), $TiO_2$-(2) and $TiO_2$-(3) (see FIG. 2A) after evaporation of 150 μM spacer in DMSO.
Figure 5:
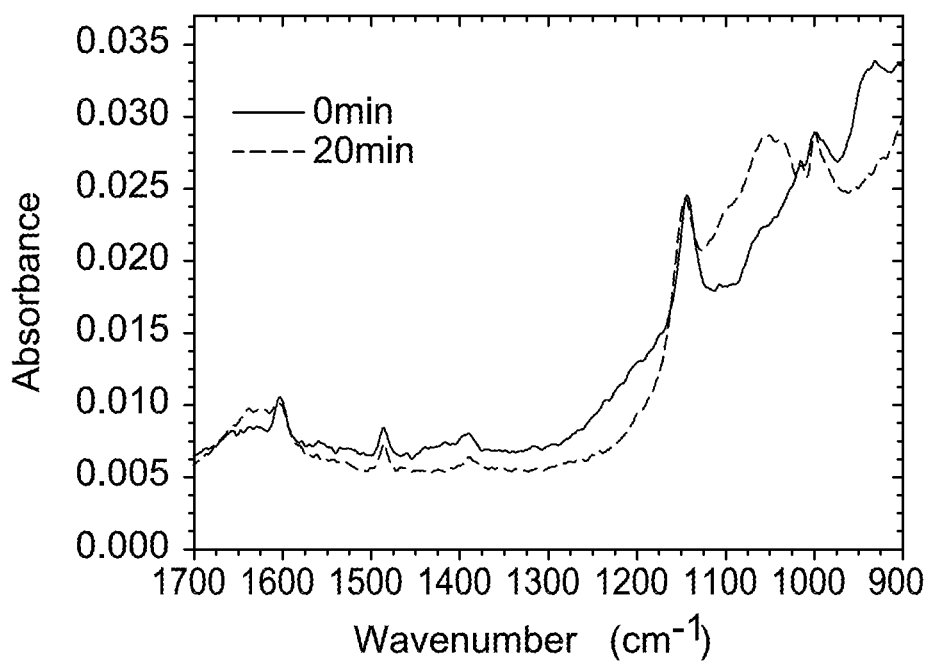
FIG. 5 are ATR-IR absorption spectra for $TiO_2$-(3) (see FIG. 2A) before and after 20 minutes $ZrOCl_2$ in aqueous 0.1 M $HClO_4$.

With reference to FIG. 2A and FIG. 4, surface modification of TiO$_2$ by 1, 2, or 3 and ZrOCl$_2$ treatment was monitored by using attenuated total reflectance infrared spectroscopy (ATR-IR). Maximum surface loading of bridging molecules was achieved by the evaporation of 150 µM DMSO solution of 1, 2, or 3, onto the TiO$_2$ film followed by soaking in methanol to remove unbound molecules and residual solvent. See Danahy, M. P.; Avaltroni, M. J.; Midwood, K. S.; Schwarzbauer, J. E.; Schwartz, J. *Langmuir* 2004, 20,5333. Comparable maximum surface loadings were observed for 1, 2, and 3. Upon soaking TiO$_2$—(X) in a 500 µM ZrOCl$_2$ solution, the non-surface bound, symmetric P—OH stretching band at 925 cm$^{-1}$ was replaced by higher energy absorption features. See FIG. 5. See Undabeytia, T.; Morillo, E.; Maqueda, C. *J. Agric. Food. Chem.* 2002, 50, 1918. These shifts are indicative of the coordination of Zr(IV) ions to free phosphonate group. See Hanson, K.; Torelli, D. A.; Vannucci, A. K.; Brennaman, M. K.; Luo, H.; Alibabaei, L.; Song, W.; Ashford, D. L.; Norris, M. R.; Glasson, C. R. K.; Concepcion, J. J.; Meyer, T. J. *Angewandte Chemie International Edition* 2012, 51, 12782.

Figure 6:
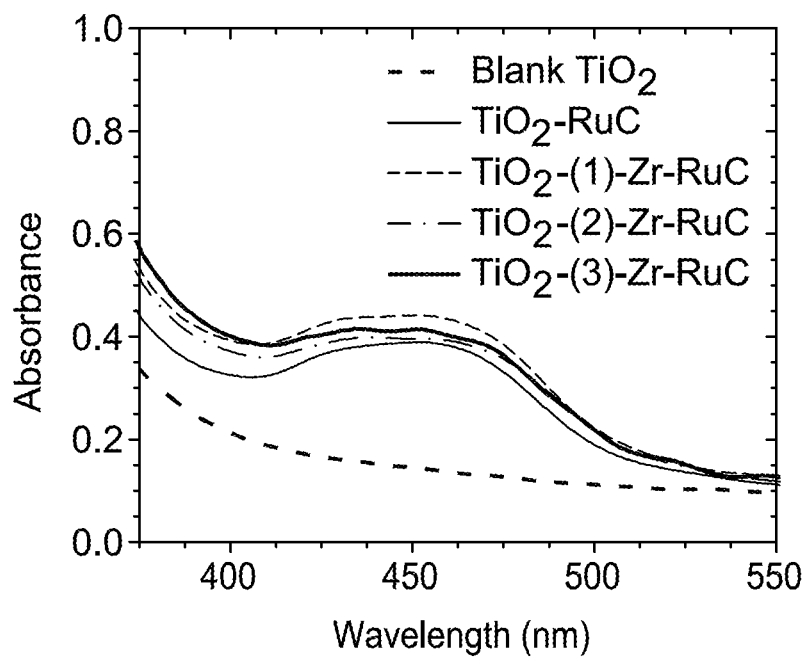
FIG. 6 are absorption spectra of $TiO_2$—RuC and $TiO_2$—(X)—Zr—RuC (X=1, 2 and 3) (see FIGS. 2A and 2B).
Figure 7:
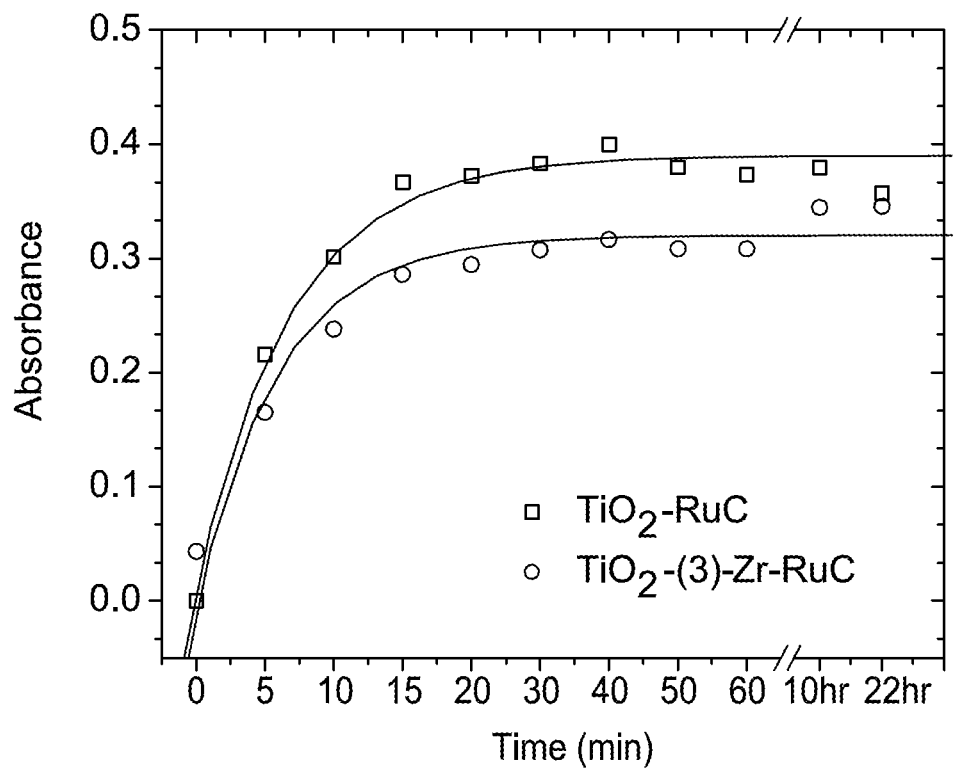
FIG. 7 are UV-Vis absorption intensity for $TiO_2$ (squares) and $TiO_2$-(3)-Zr (dots) (see FIGS. 2A and 2B) at 460 nm versus time soaking in 200 μM RuC in MeOH.
Figure 8A:
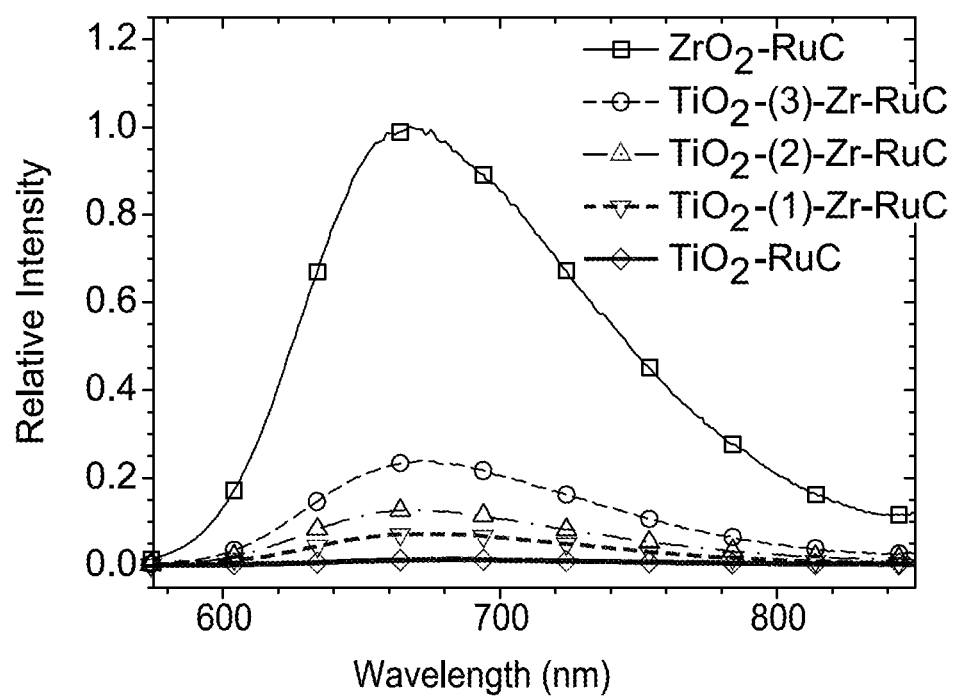
FIG. 8A is a graph depicting the steady-state emission spectra with $\lambda_{ex}$=400 nm for various multilayer assemblies according to the invention.

RuC binding to TiO$_2$—(X)—Zr obeys isotherm behavior with a maximum surface coverage comparable to that of RuC directly on TiO$_2$. See FIGS. 6 and 7. The retention of phosphonate peaks in ATR-IR spectra indicate that RuC does not competitively desorb the bridging molecule, presumably because of the higher binding affinity of phosphonate groups compared to carboxylates. See Hanson, K.; Brennaman, M. K.; Luo, H.; Glasson, C. R. K.; Concepcion, J. J.; Song, W.; Meyer, T. J. *ACS Appl. Mater. Interfaces* 2012, 4, 1462. The absorption (FIG. 6) and emission (FIG. 8A) spectral features of TiO$_2$—RuC and TiO$_2$—(X)—Zr—RuC are indistinguishable indicating that the chromophore and bridge are only weakly electronically coupled.

The above results are consistent with formation of a TiO$_2$—(X)—Zr—RuC multilayer structure resembling the scheme in FIG. 2B. It is important to mention that we have no direct information about local coordination chemistry and that FIG. 2B is a reasonable but unsupported representation that does not exclude other binding modes. Due to the complexity of the interface we are currently unable to rule out at least some fraction of RuC binding directly to the metal-oxide surface.

Thin Film Photophysics.

The excitation-quenching-back electron transfer events for RuC on a metal oxide (MO$_2$) are described in equations 12-15.

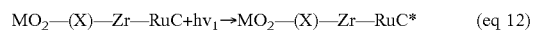
$$MO_2—(X)—Zr—RuC+h\nu_1 \rightarrow MO_2—(X)—Zr—RuC^* \quad (eq\ 12)$$

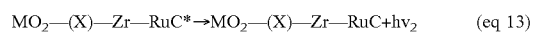
$$MO_2—(X)—Zr—RuC^* \rightarrow MO_2—(X)—Zr—RuC+h\nu_2 \quad (eq\ 13)$$

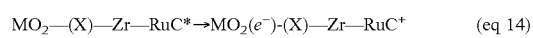
$$MO_2—(X)—Zr—RuC^* \rightarrow MO_2(e^-)-(X)—Zr—RuC^+ \quad (eq\ 14)$$

$$MO_2(e^-)-(X)—Zr—RuC^+ \rightarrow MO_2—(X)—Zr—RuC \quad (eq\ 15)$$

Briefly summarized, photoexcitation of the dye (eq 12), is followed by either radiative/non-radiative decay (eq 13) or electron injection into the metal oxide semiconductor (eq 14). The injected electron can then undergo back electron transfer, returning the system to its original state (eq 15).

Forward electron transfer. Photoluminescence (eq 13) and electron injection rates/yield (eq 14) of TiO$_2$—RuC and TiO$_2$—(X)—Zr—RuC were probed by using steady-state and time-resolved emission spectroscopy and the results are summarized in Table 1. The photophysical properties of RuC were also investigated on nanocrystalline ZrO$_2$ which is inert toward electron injection from RuC* to ZrO$_2$. See Katoh, R.; Furube, A.; Yoshihara, T.; Hara, K.; Fujihashi, G.; Takano, S.; Murata, S.; Arakawa, H.; Tachiya, M. *The Journal of Physical Chemistry B* 2004, 108, 4818. Significant photoluminescent quenching is observed from TiO$_2$—RuC ($\Phi_{PL}$<0.01%) relative to ZrO$_2$—RuC ($\Phi_{PL}$=10.2%) which can be attributed to fast excited state electron transfer from RuC* into the conduction band of TiO$_2$ (eq 14). See Banerjee, T.; Biswas, A. K.; Reddy G, U.; Sahu, T. S.; Das, A.; Ganguly, B.; Ghosh, H. N. *The Journal of Physical*

*Chemistry C* 2014, 118, 3864. The addition of a molecular bridges and $Zr^{4+}$ ion between RuC and $TiO_2$ increases the photoluminescent quantum yield in the order 1 (0.81%), 2 (1.06%), and 3 (2.54%) suggesting that emission quenching by electron transfer is decreased as the bridge length is increased.

RuC>$TiO_2$-(3)-Zr—RuC>$TiO_2$-(2)-Zr—RuC>$TiO_2$-(1)-Zr—RuC>$TiO_2$—RuC.

In a previous report, Gray and coworkers estimated electron injection rates ($k_{inj}$) from time-resolved emission traces by assuming that radiative ($k_r$) and non-radiative ($k_{nr}$) decay rates were similar for dyes in solution and bound to $TiO_2$. See Kilså, K.; Mayo, E. I.; Kuciauskas, D.; Villahermosa, R.; Lewis, N. S.; Winkler, J. R.; Gray, H. B. *The Journal of Physical Chemistry A* 2003, 107, 3379. In these calculations, $k_{nr}$ represents all non-radiative deactivation pathways not associated with electron transfer quenching. Here we employ a similar methodology but use the emission from $ZrO_2$—RuC as the model system for $k_r$ and $k_{nr}$ determination because it presumably more accurately represents, as compare to solution, the photophysical properties of the dye on the $TiO_2$ surface.

$k_r$ and $k_{nr}$ rate constants for $ZrO_2$—RuC are listed in Table 3 and were calculated from the quantum yield and average

TABLE 1

Photophysical properties of $ZrO_2$—RuC, $TiO_2$—RuC and $TiO_2$—(X)—Zr—RuC (X = 1, 2 and 3) in a MeCN solution of 0.3M $LiClO_4$.

|  | $\lambda_{max}$ (nm)[a] | Lifetime (ns)[b] | | |
| --- | --- | --- | --- | --- |
|  |  | $\tau_1$ ($A_1$) | $\tau_2$ ($A_2$) | <$\tau$> |
| $TiO_2$—RuC | 560 | 43 (0.41) | 276 (0.59) | 253 |
| $TiO_2$—(1)—Zr—RuC | 560 | 167 (0.18) | 695 (0.82) | 668 |
| $TiO_2$—(2)—Zr—RuC | 560 | 194 (0.17) | 790 (0.83) | 761 |
| $TiO_2$—(3)—Zr—RuC | 560 | 212 (0.14) | 857 (0.86) | 832 |
| $ZrO_2$—RuC | 560 | 328 (0.06) | 970 (0.94) | 956 |

[a]Excitation at 400 nm,
[b]Excitation at 445 nm.

TABLE 2

Injection yields, average back electron transfer lifetimes, and $k_{bet}$ from transient absorption measurements of $TiO_2$—RuC and $TiO_2$—(X)—Zr—RuC (X = 1, 2 and 3) in a MeCN solution of 0.3M $LiClO_4$. (Ex: 532, Abs: 405 nm)

|  | $\Phi_{inj}$[a] | Lifetime (μs)[b] | | | | |
| --- | --- | --- | --- | --- | --- | --- |
|  |  | $\tau_1$ ($A_1$) | $\tau_2$ ($A_2$) | $\tau_3$ ($A_2$) | <$\tau$> | $k_{bet}$ (×$10^4$ $s^{-1}$)[c] |
| $TiO_2$—(3)—Zr—RuC | 0.5 | 0.16 (0.4) | 1.21 (3.0) | 22.8 (96.6) | 22.8 | 4.4 |
| $TiO_2$—(2)—Zr—RuC | 0.65 | 0.15 (0.5) | 1.19 (4.2) | 19.8 (95.3) | 19.8 | 5.0 |
| $TiO_2$—(1)—Zr—RuC | 0.75 | 0.13 (0.5) | 1.10 (4.3) | 18.1 (95.2) | 18.1 | 5.5 |
| $TiO_2$—RuC | 1 | 0.10 (0.6) | 1.00 (4.7) | 16.6 (94.7) | 16.6 | 6.0 |

[a]Pump intensity at 5 mJ/pulse,
[b]Pump intensity was adjusted between 2.5 and 5 mJ/pulse so that the ΔA of all four samples were similar at ~20 ns,
[c]1/<$\tau$> = $k_{bet}$.

Figure 8B:
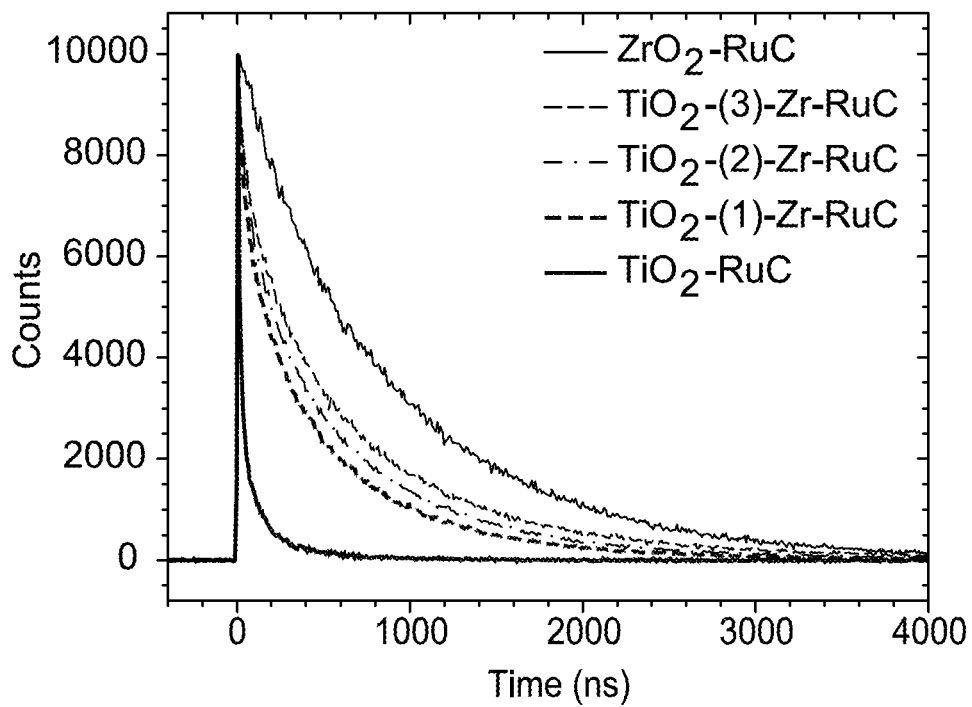
FIG. 8B is a graph comprising the time-resolved emission traces with $\lambda_{ex}$=445 nm of various multilayer assemblies of the invention in a MeCN solution of 0.3 M $LiClO_4$.

Time-resolved emission decays were recorded by time correlated single-photon counting and the results are shown in FIG. 8B. As found for other dynamic processes on nanocrystalline metal oxide interfaces, emission decay kinetics are complex but were satisfactorily fit with a biexponential function and the results are presented as a weighted average lifetime (<$\tau$>) in Table 3. For the fast and slow components (Table 1), as well as the weighted average, the emission lifetime decreases in the order $ZrO_2$— lifetime by using $k_r = \Phi/<\tau>$ and $k_{nr} = (1-\Phi)/<\tau>$. Assuming that $k_r$ and $k_{nr}$ for $TiO_2$—RuC and $TiO_2$—(X)—Zr—RuC are similar to $ZrO_2$—RuC, the $k_{inj}$ can be calculated by using $\tau = 1/(k_r + k_{nr} + k_{inj})$. See Hanson, K.; Wilger, D. J.; Jones, S. T.; Harrison, D. P.; Bettis, S. E.; Luo, H.; Papanikolas, J. M.; Waters, M. L.; Meyer, T. J. *Peptide Science* 2013, 100, 25. The electron injection rate constant decreases in the order X=3 (1.56×$10^5$ $s^{-1}$)<X=2 (2.68×$10^5$ $s^{-1}$)<X=1 (4.51×$10^5$ $s^{-1}$)<$TiO_2$—RuC (29.1×$10^5$ $s^{-1}$).

TABLE 3

Photophysical properties of $ZrO_2$—RuC, $TiO_2$—RuC and $TiO_2$—(X)—Zr—RuC in a MeCN solution of 0.3M $LiClO_4$.

| Film | $\Phi_{PL}$ (%)[a] | <$\tau$> (ns)[b] | $k_r$ (×$10^5$ $s^{-1}$)[c] | $k_{nr}$ (×$10^5$ $s^{-1}$)[d] | $k_{inj}$ (×$10^5$ $s^{-1}$)[e] | $\Phi_{inj}$ (%)[f] |
| --- | --- | --- | --- | --- | --- | --- |
| $ZrO_2$—RuC | 10.2 | 956 | 1.07 | 9.39 | — | 0 |
| $TiO_2$—(3)—Zr—RuC | 2.54 | 832 | 1.07[g] | 9.39[g] | 1.56 | 75 |
| $TiO_2$—(2)—Zr—RuC | 1.06 | 761 | 1.07[g] | 9.39[g] | 2.68 | 89 |
| $TiO_2$—(1)—Zr—RuC | 0.81 | 668 | 1.07[g] | 9.39[g] | 4.51 | 92 |
| $TiO_2$—RuC | <0.01 | 253 | 1.07[g] | 9.39[g] | 29.1 | 100 |

[a]Measured using an integrating sphere according to previously published procedure, McNeil, I. J.; Ashford, D. L.; Luo, H.; Fecko, C. J. *The Journal of Physical Chemistry C* 2012, 116, 15888.
[b]weighted average lifetime from the biexponential fit (ex: 445 nm),
[c]$k_r = \Phi_{PL}/\tau$,
[d]$k_{nr} = (1 - \Phi_{PL})/\tau$,
[e]$\tau = 1/(k_r + k_{nr} + k_{inj})$,
[f]$\Phi_{inj(TiO2)} = (1 - \Phi_{PL(TiO2)}/\Phi_{PL(ZrO2)})$ and
[g]$k_r$ and $k_{nr}$ are assumed to be similar to $ZrO_2$—RuC.

Figure 9:
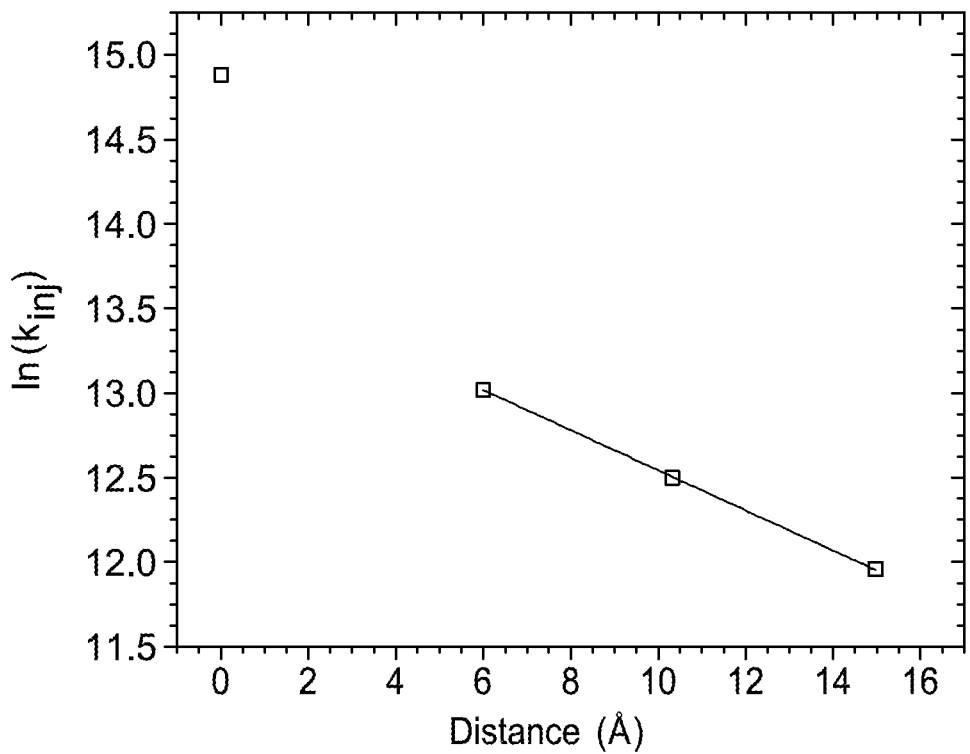
FIG. 9 is a plot of the natural log of $k_{inj}$ versus spacer length. Slope of the line indicates the β value.

The exponential decay of electron transfer rate with respect to distance is typically described with the equation $k_{ET}=k_0 e^{-\beta r}$ where $k_0$ is the rate constant at the van der Waals distance, $\beta$ is the attenuation coefficient and r is the distance between donor and acceptor. See Wenger, O. S. *Accounts of Chemical Research* 2010, 44, 25. In the multilayer films, the unknown Zr ion coordination chemistry hinders the accurate assignment of a donor (RuC) to acceptor ($TiO_2$) distance. Therefore, similar to previous reports (Myahkostupov, M.; Piotrowiak, P.; Wang, D.; Galoppini, E. *The Journal of Physical Chemistry C* 2007, 111, 2827.), we instead refer to the relative phosphorous-phosphorous distance for bridges 1 (6.3 Å), 2 (10.8 Å), and 3 (15.0 Å). For $TiO_2$—(X)—Zr—RuC a plot of the spacer length versus $\ln(k_{inj})$ can be fit with a straight line where the slope is equal to the $\beta$ value of 0.12 Å$^{-1}$. See FIG. 9. The exponential dependence of $k_{inj}$ on bridge length as well as a $\beta$ value that is slightly lower, but still within reasonable agreement with other phenyl bridge systems ($\beta$=0.2–0.5 Å$^{-1}$), suggests that electron transport from RuC* to $TiO_2$ is at least in part mediated by bridging molecules 1, 2, and 3. See Hanss, D.; Walther, M. E.; Wenger, O. S. *Coordination Chemistry Reviews* 2010, 254, 2584; and Davis, W. B.; Svec, W. A.; Ratner, M. A.; Wasielewski, M. R. *Nature* 1998, 396, 60.

It is important to note that due to the limited temporal resolution of the measurement (>500 ps) these are low end estimates of $k_{inj}$. Direct measurement of $k_{inj}$ by fs-ps transient absorption spectroscopy are currently underway but we anticipate similar trends.

The relative electron injection efficiencies ($\Phi_{inj}$) for $TiO_2$—RuC and $TiO_2$—(X)—Zr—RuC were calculated from their emission quantum yields by using $\Phi_{inj(TiO2)}=(1-\Phi_{PL(TiO2)}/\Phi_{PL(ZrO2)})$ and the results are summarized in Table 3. Despite the decreased electron injection rate, the electron injection efficiencies remain high >75% for $TiO_2$—(X)—Zr—RuC. Presumably the $^3$MLCT excited state of RuC is sufficiently long lived (~1 μs) that $k_{inj}$ is highly competitive with $k_r$ and $k_{nr}$.

Figure 11:
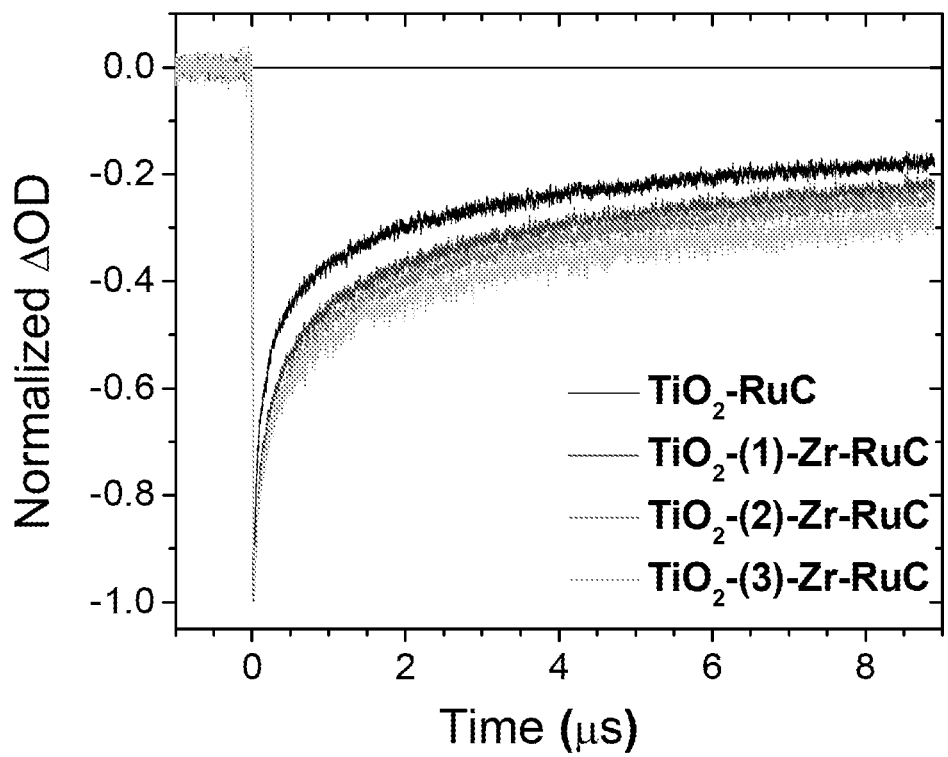
FIG. 11 are plots of absorption-time traces of the films, from top to bottom, $TiO_2$—RuC and $TiO_2$—(X)—Zr—RuC (X=1, 2 and 3) (see FIGS. 2A and 2B) monitored at 405 nm in a MeCN solution of 0.3 M $LiClO_4$ ($\lambda_{ex}$=532 nm).

Back Electron Transfer. Back electron transfer dynamics ($k_{bet}$) and electron injection yield for $TiO_2$—RuC and $TiO_2$—(X)—Zr—RuC were investigated by nanosecond transient absorption (TA) measurements at the ground state/excited state isosbestic point of RuC on $ZrO_2$ (405 nm). Absorption-time kinetic traces at 405 nm following 532 nm excitation are shown in FIG. 11. The laser intensity was adjusted from 2.5-5 mJ/pulse to produce comparable ΔA for all samples, mitigating the influence of $TiO_2(e^-)$ concentration on back electron transfer dynamics. See Brennaman, M. K.; Patrocinio, A. O. T.; Song, W.; Jurss, J. W.; Concepcion, J. J.; Hoertz, P. G.; Traub, M. C.; Murakami Iha, N. Y.; Meyer, T. J. *ChemSusChem* 2011, 4, 216.

Figure 10:
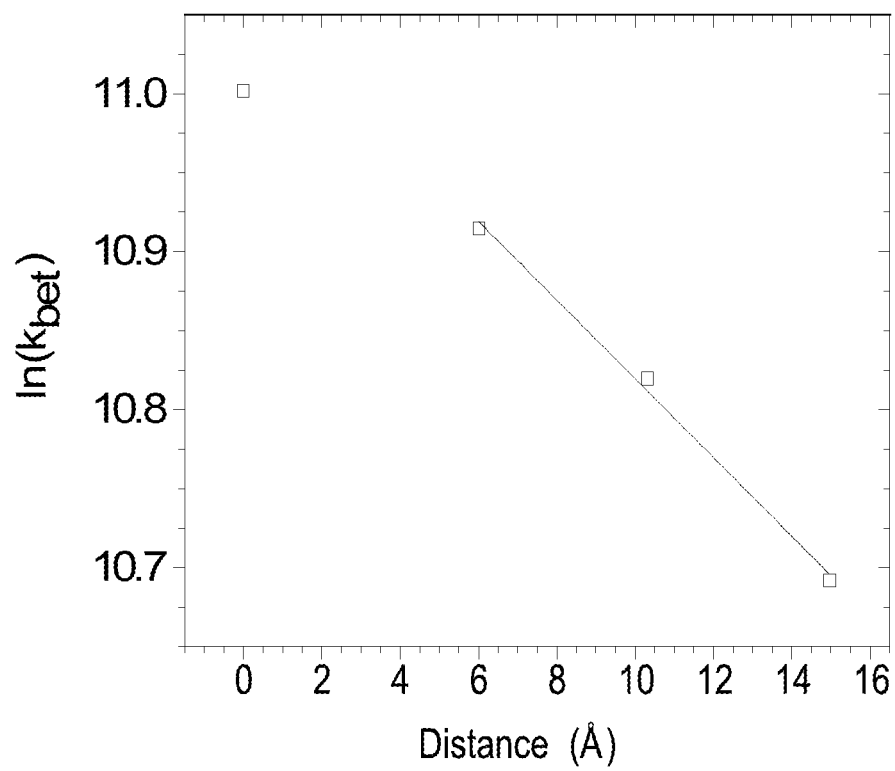
FIG. 10 is a plot of the natural log of $k_{bet}$ versus spacer length. Slope of the line indicates the β value.

The decay kinetics were fit over the first 10 μs by using a tri-exponential function (Table 2) and weighted-average <τ> are reported in Table 4. For all three components, the weighted average, and by visual inspection there is a general trend of decreasing $k_{bet}$ with increased separation of $TiO_2$ and RuC. While there is an exponential dependence of $k_{bet}$ on spacer length (see FIG. 10), the distance dependence is weak ($\beta$=0.03 Å$^{-1}$) suggesting that despite the slowed interfacial electron transfer rate, $k_{bet}$ is dominated by $TiO_2$ ($e^-$) trapping/detrapping kinetics. See Johansson, P. G.; Kopecky, A.; Galoppini, E.; Meyer, G. J. *Journal of the American Chemical Society* 2013, 135, 8331.

TABLE 4

Injection yields, average back electron transfer lifetimes, and $k_{bet}$ from transient absorption measurements of $TiO_2$—RuC and $TiO_2$—(X)—Zr—RuC (X = 1, 2 and 3) in a MeCN solution of 0.3M LiClO$_4$. (Ex: 532, Abs: 405 nm)

| Film | $\Phi_{inj}$ (%)$^a$ | <τ> (μs)$^b$ | $k_{bet}$ (×10$^4$ s$^{-1}$)$^c$ |
|---|---|---|---|
| $TiO_2$—(3)—Zr—RuC | 50 | 22.8 | 4.4 |
| $TiO_2$—(2)—Zr—RuC | 65 | 19.8 | 5.0 |
| $TiO_2$—(1)—Zr—RuC | 75 | 18.1 | 5.5 |
| $TiO_2$—RuC | 100 | 16.6 | 6.0 |

$^a$Pump intensity at 5 mJ/pulse,
$^b$Pump intensity was adjusted between 2.5 and 5 mJ/pulse so that the ΔA of all four samples were similar at ~20 ns,
$^c$1/<τ> = $k_{bet}$.

Electron injection efficiencies ($\Phi_{inj}$) were obtained by using thin film actinometry with $TiO_2$—RuC ($\Phi_{inj}$=100%) as the reference. See Bergeron, B. V.; Kelly, C. A.; Meyer, G. J. *Langmuir* 2003, 19, 8389. ΔA values for all samples were evaluated at 20 ns following 532 nm excitation at 5.0 mJ/pulse. The trend in injection yields was reproducible for three separate samples with yields decreasing in the order: $TiO_2$-(1)-Zr—RuC (75%)>$TiO_2$-(2)-Zr—RuC (65%)>$TiO_2$-(1)-Zr—RuC (55%).

Despite having similar trends there is a discrepancy between the $\Phi_{inj}$ obtained by time-resolved emission and by TA. This variation could be attributed to a number of factors. For example, the mechanism of measurement. That is, while TA is a dynamic process, emission quantum yields are obtained under steady state conditions. The limited time resolution of the TA measurement does not account for fast BET events (<20 ns) and therefore the measured ΔA only provides a low end estimate of injection yields. Another possibility is the presence of an unidentified, additional non-radiative decay pathway present on $TiO_2$ but not $ZrO_2$ that does not involve electron transfer quenching. See Hanson, K.; Brennaman, M. K.; Ito, A.; Luo, H.; Song, W.; Parker, K. A.; Ghosh, R.; Norris, M. R.; Glasson, C. R. K.; Concepcion, J. J.; Lopez, R.; Meyer, T. J. *The Journal of Physical Chemistry C* 2012, 116, 14837.

Regardless of the discrepancy in calculated $\Phi_{inj}$, steady-state emission, time-resolved emission and transient absorption measurements all suggest a distance dependent electron transfer mechanism in the self-assembled multilayer films. These results are consistent with formation of the $TiO_2$—(X)—Zr—RuC multilayer structure depicted in FIG. 2B. With the bridging molecules examined here, $k_{bet}$ is only decreased by ~25%, well below the changes necessary to optimize dye-sensitized devices. However, the modular nature of the self-assembled multilayer strategy makes it an ideal scaffold to explore how the nature of the bridging molecule influences electron transfer rate. These experiments are currently underway.

In conclusion, the present invention is directed to a new scaffolding, self-assembled multilayers, to study and control electron transfer dynamics at chromophore-metal oxide interfaces. The multilayer films are achieved by stepwise layering of bridging molecules, linking ions, and then chromophores on a metal oxide surface. The proposed architecture is supported by UV-Vis and ATR-IR measurements of the films. Steady-state emission, time-resolved emission and transient absorption measurements all indicate that the electron transfer rate is dependent on the length of the bridging molecule. These results are consistent with formation of the $TiO_2$—(X)—Zr—RuC multilayer structure depicted in FIG. 2B. However, with the bridging molecules examined here, $k_{bet}$ is only decreased by ~25%, well below the changes necessary to optimize dye-sensitized devices. However, the self-assembled multilayer strategy is simple and offers considerable flexibility for the selection of chromophore and molecular bridge as compared to synthetically laborious, covalently linked bridge-dye systems. The modular nature of the self-assembled multilayer strategy makes it an ideal scaffold to examine how the nature of the bridging molecule influences electron transfer dynamics at the interface with the ultimate goal of slowing BET events.

Experimental Section 2.

In an ideal DSSC, electron transfer from a photoexcited dye to a semiconducting metal oxide surface ($k_{inj}$) and from the redox mediator to the oxidized dye ($k_{regen}$) are very fast and will occur at near unity efficiency. Equally important is the inhibition of deleterious recombination processes where the injected electron in the conduction band of the metal oxide recombines with either the oxidized dye ($k_{BET}$) or the redox mediator ($k_{recomb}$). Slowing these recombination rates by one order of magnitude can increase the open-circuit voltage by 50 mV or more.

Materials $TiO_2$ paste (18 NR-T) was purchased from Dyesol and used as received. Ruthenium dye (cis-bis(isothiocyanato)-bis(2,2'-bipyridyl-4,4'-dicarboxylic acid) Ruthenium(II), N3) was used as purchased from Solaronix. Fluorine doped Tin Oxide (FTO) glass substrates(Hartford Glass Co; sheet resistance 15 $\Omega cm^{-2}$) were used after sonicating with ethanol and HCL/Ethanol (15/85% mix) for 20 mins each. 1-butyl-3-methylimidazolium iodide (BMII, Aldrich), Iodine ($I_2$, Fisher Scientific), 4-tert-butylpyridine (TBP, Aldrich), and guanidium thiocyanate (GSCN, Aldrich), Acetonitrile and Valeronitrile (Aldrich) which served as electrolyte constituents and solvents were all used as purchased without further purification. $TiO_2$ films, ~4 μm thick, coating an area of 5 mm×5 mm on top of FTO glass were prepared by doctor blading (1 layer of scotch tape).

Multilayer Film Preparation.

Multilayer films were prepared according to literature procedure with minor modification to incorporate N3 into the multilayer scheme. See Wang, J. C.; Murphy, I. A.; Hanson, K., Modulating Electron Transfer Dynamics at Dye-Semiconductor Interfaces Via Self-Assembled Multilayers. *The Journal of Physical Chemistry C* 2015, 119 (7), 3502-3508. Briefly, the molecular bridges were loaded onto the surface by placing the films vertically in 12.5 mL of 150 μM solution of 1, 2 and 3 in DMSO followed by slow evaporation of solvent at 170° C. over the course of 12 hours. Upon completion, the slides were removed from solution, rinsed with methanol and dried under a stream of air. Zirconium treatments were performed by immersing the $TiO_2$—(X) (X=1, 2, and 3) films in a 0.1M $HClO_4$ aqueous solution of 500 μM $ZrOCl_2$ for four hours to ensure complete $Zr^{4+}$ binding. N3 loading was achieved by soaking the $TiO_2$ and/or $TiO_2$—(X)—Zr films in a 400 μM N3 in EtOH overnight followed by subsequent rinsing of MeCN to remove any unbounded dye.

DSSC Fabrication.

The monolayer and multilayer films served as the photoanode while cathode for the cell was obtained by thermal evaporation (400° C.) of a ~4 mM solution of $H_2PtCl_6$ in ethanol. DSSCs were assembled by sandwiching dye sensitized multilayer films with the Pt counter electrode using a 25 μm thick surlyn thermo plastic (Meltonix 1170-25 from Solaronix) and heating the assembly at 150° C. Electrolyte (0.6M BMII, 0.3M $I_2$, 0.1M GSCN, 0.5M TBP in a 85:15 mixture of acetonitrile and valeronitrile) was introduced into the cell through a hole on the counter electrode and the hole was sealed by surlyn sheet and micro-cover glass.

Characterization.

The samples were irradiated with an AM1.5 Solar Spectrum generated from a 300W Xenon arc lamp (Ushio, UXL-302-O) enclosed in a Oriel Research Arc lamp Housing (Newport, 67005) with the light output passed through a AM 1.5 Global filter (Newport, 81094) and mechanical shutter (Newport, 71445). The light intensity was measured using a Calibrated reference cell and meter (Newport, 91150V) and the light intensity was adjusted by using neutral density filters. The light was focused through a monochromator onto the cells and scanned from 300 to 800 nm to generate the IPCE. Electrochemical Impedance Spectroscopy (Gamry Potentiostat) was performed and scanned from frequency range of $10^6$ Hz to 0.025 Hz after conditioning the cells for 15 s and allowing an initial delay of 100 s. The perturbation amplitude was 10 mV. The Nyquist and Bode plots were simulated with Gamry Echem Analyst Software to evaluate EIS parameters. Open circuit voltage decay was performed using Gamry Potentiostat. The lamp was left on for 10 s and turned off while the decay in open circuit voltage was measured for each device.

Results and Discussion

The multilayer films ($TiO_2$—(X)—Zr—N3) are composed of a nano-crystalline $TiO_2$, a bridging molecule (X=1, 2 or 3), Zr(IV) linking ions and $Ru(bpy)_2(NCS)_2$ (N3) as the dye. See FIG. 2C. N3 was selected as the dye for the current study (See FIG. 2A) because of the well understood behaviour of N3 in DSSCs. See Grätzel, M., Dye-Sensitized Solar Cells. *Journal of Photochemistry and Photobiology C: Photochemistry Reviews* 2003, 4 (2), 145-153. The multilayer films were prepared by a stepwise soaking according to our previously published procedure. See Wang, J. C.; Murphy, I. A.; Hanson, K., Modulating Electron Transfer Dynamics at Dye-Semiconductor Interfaces Via Self-Assembled Multilayers. *The Journal of Physical Chemistry C* 2015, 119 (7), 3502-3508. Comparable surface loadings were obtained for both N3 in the multilayer films and N3 directly on the nanocrystalline $TiO_2$ surface.

Figure 12:
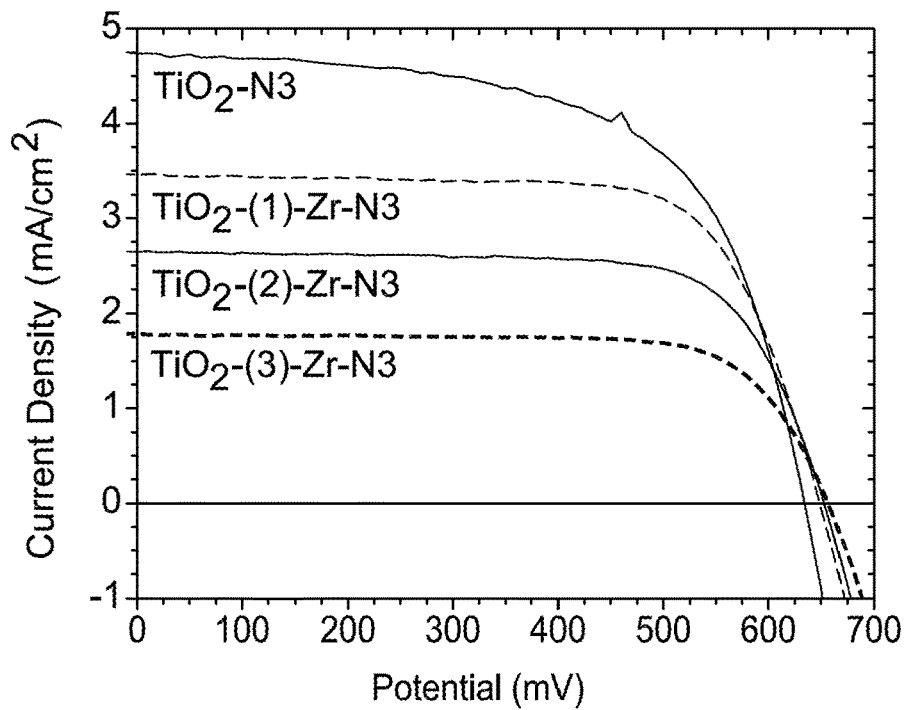
FIG. 12 are plots of photocurrent density-voltage (J-V) characteristics for DSSCs with photoanodes composed of $TiO_2$—N3 and $TiO_2$—(X)—Zr—N3 (X=1, 2 and 3) (see FIGS. 2A and 2C) under AM1.5 irradiation (100 mW/cm²).

The $TiO_2$—(X)—Zr—N3 films were incorporated into a standard DSSC architecture with iodide-triiodide redox mediator and a platinum counter electrode (see cell assembly details in the experimental section). Current-voltage relationships for DSSCs with both monolayer and multilayer films were obtained and the results are summarized in FIG. 12 and Table 5.

TABLE 5

Performance characteristics of DSSCs containing monolayer and multilayer photoanodes.[a]

| | $J_{sc}$ (mA/cm$^2$) | $V_{oc}$ (mV) | FF | η (%) |
|---|---|---|---|---|
| $TiO_2$—N3 | 4.87 ± 0.1 | 634 ± 2 | 0.62 ± 0.02 | 1.9 ± 0.1 |
| $TiO_2$—(1)—Zr—N3 | 3.55 ± 0.5 | 648 ± 1 | 0.71 ± 0.02 | 1.6 ± 0.2 |
| $TiO_2$—(2)—Zr—N3 | 2.82 ± 0.2 | 652 ± 4 | 0.72 ± 0.04 | 1.3 ± 0.1 |
| $TiO_2$—(3)—Zr—N3 | 1.95 ± 0.3 | 654 ± 2 | 0.74 ± 0.01 | 0.9 ± 0.1 |

[a]All data are the average value from the measurement of three different DSSCs and the error bars are the standard deviation of those measurements.

Figure 13:
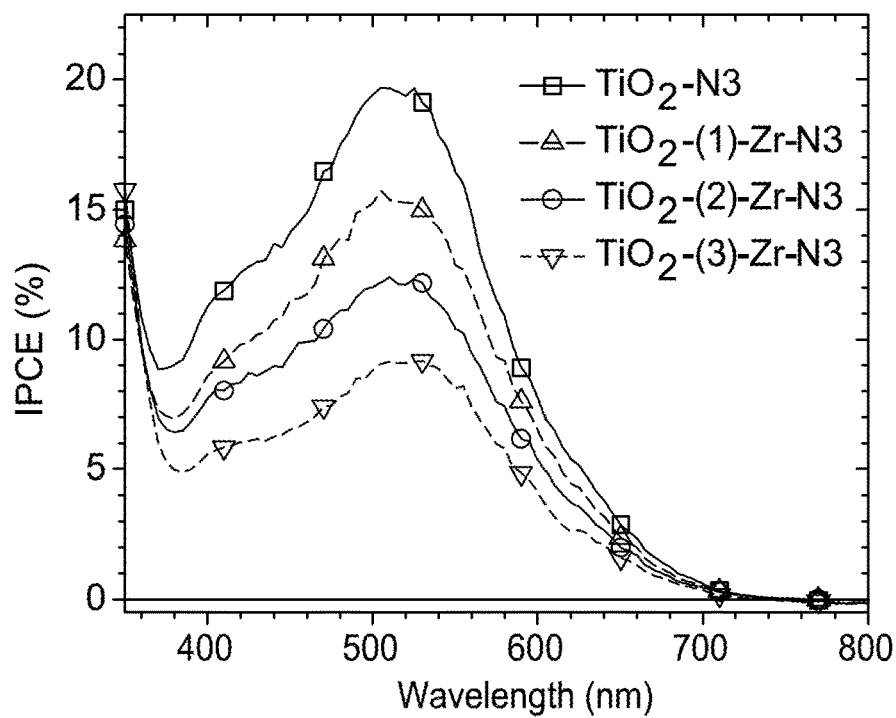
FIG. 13 are plots of incident photo-to-current conversion efficiency for DSSCs composed of $TiO_2$—N3 and $TiO_2$—(X)—Zr—N3 (X=1, 2 and 3) (see FIGS. 2A and 2C).

Perhaps the most obvious trend from the J-V curves is the decrease in short circuit current ($J_{sc}$) from $TiO_2$—N3 to $TiO_2$-(1)-Zr—N3 and continued decrease with the addition of each subsequent spacer unit. All samples gave a similar spectral response in the IPCE measurement but also reflected a similar decrease in current with increased spacer length. See FIG. 13.

As reported previously, the bridging molecules act as a tunneling barrier for electron transfer from the excited dye to the metal-oxide surface with an exponential decrease in electron injection rate ($k_{inj}$) with respect to bridge length. To obtain 100% electron injection yield, the slowest components of $k_{inj}$ must be faster than $k_r$, $k_{nr}$ and all other excited state quenching mechanism (e.g. $I_2$ quenching of N3*). See Johansson, P. G.; Kopecky, A.; Galoppini, E.; Meyer, G. J., Distance Dependent Electron Transfer at $TiO_2$ Interfaces Sensitized with Phenylene Ethynylene Bridged Ru(Ii)-Isothiocyanate Compounds. *J. Am. Chem. Soc.* 2013, 135 (22), 8331-41. From transient absorption measurements, a decrease in $k_{inj}$ for $TiO_2$—(X)—Zr—RuC results in a decrease in electron injection yield ($\Phi_{inj}$) in the order: $TiO_2$—RuC (100%)>$TiO_2$-(1)-Zr—RuC (75%)>$TiO_2$-(2)-Zr—RuC (65%)>$TiO_2$-(3)-Zr—RuC (50%). Assuming the $J_{sc}$ directly corresponds with electron injection yield, a similar trend is observed in the devices reported here: $TiO_2$—N3 (100%)>$TiO_2$-(1)-Zr—N3 (73%)>$TiO_2$-(2)-Zr—N3 (58%)>$TiO_2$-(3)-Zr—N3 (40%). This is surprising, given that a significantly shorter excited state lifetime ($\tau$<10 ns) and faster $k_r$ and $k_{nr}$ for N3, as compared to RuC ($\tau$=956 ns), which will become highly competitive as $k_{inj}$ is decreased. See Du, L.; Furube, A.; Hara, K.; Katoh, R.; Tachiya, M., Mechanism of Particle Size Effect on Electron Injection Efficiency in Ruthenium Dye-Sensitized $TiO_2$ Nanoparticle Films. *The Journal of Physical Chemistry C* 2010, 114 (18), 8135-8143. In fact, the injection yield is likely much lower for $TiO_2$—(X)—Zr—N3 as compared to $TiO_2$—(X)—Zr—RuC but, as will be discussed below, photocurrent loses due to recombination are inhibited with the addition of spacer molecules and thus the decrease in injection yield is compensated by an increased harvesting efficiency for the injected electrons. For devices prepared with ALD "insulating" layers, there is an analogous decreases in $J_{sc}$ with respect to $Al_2O_3$ thickness between the dye and $TiO_2$. Similar to our current system, the decrease in $J_{sc}$ is attributed to a decrease in $k_{inj}$ with respect to distance. See Hamann, T. W.; Farha, O. K.; Hupp, J. T., Outer-Sphere Redox Couples as Shuttles in Dye-Sensitized Solar Cells. Performance Enhancement Based on Photoelectrode Modification Via Atomic Layer Deposition. *J. Phys. Chem. C* 2008, 112 (49), 19756-19764 and Antila, L. J.; Heikkilä, M. J.; Aumanen, V.; Kemell, M.; Myllyperkiö, P.; Leskelä, M.; Korppi-Tommola, J. E. I., Suppression of Forward Electron Injection from Ru(dcbpy)$_2$(NCS)$_2$ to Nanocrystalline $TiO_2$ Film as a Result of an Interfacial $Al_2O_3$ Barrier Layer Prepared with Atomic Layer Deposition. *The Journal of Physical Chemistry Letters* 2009, 1 (2), 536-539.

Despite the decrease in $J_{sc}$, there is a small, but reproducible, increase in $V_{oc}$ in the order $TiO_2$—N3<$TiO_2$-(1)-Zr—N3<$TiO_2$-(2)-Zr—N3<$TiO_2$-(3)-Zr—N3. In a DSSC the $V_{oc}$ is dictated by the energy difference between the Fermi level of the electrons within $TiO_2$ and the redox potential of the mediator. See Nazeeruddin, M. K.; Baranoff, E.; Grätzel, M., Dye-Sensitized Solar Cells: A Brief Overview. *Solar Energy* 2011, 85 (6), 1172-1178. Given that the all the cells are composed of the same redox mediator (0.6M 1-buty-3-methylimidazolium iodide, 0.3M $I_2$,) and chromophore, the increase in $V_{oc}$ can be attributed to increased electron density within the $TiO_2$. The trend in increasing $V_{oc}$ suggest that although fewer electrons are being injected into the conduction band of $TiO_2$ (vida supra), the fraction of injected electrons that are lost due to recombination ($k_{BET}$ or $k_{recom}$) decreases with the addition of bridging molecules.

Despite the increases in $V_{oc}$ and FF, the overall device ($\eta$ in Table 1) efficiencies decrease in the order $TiO_2$-N3 (1.9%)>$TiO_2$-(1)-Zr—N3 (1.6%)>$TiO_2$-(2)-Zr—N3 (1.3%)>$TiO_2$-(3)-Zr—N3 (0.9%). Any contribution of enhanced $V_{oc}$ and FF to increasing device performance is far outweighed by the significant decrease in $J_{sc}$ with increasing dye-$TiO_2$ separation. It is worth noting that the relatively low efficiency of the devices presented here, even for the standard $TiO_2$—N3 device, can be attributed to the relatively small film thickness (~4 μm) as well as the lack of scattering layer, $TiCl_4$ treatment, electrode passivation treatment, etc. However, we anticipate that similar trends would be observed in an optimized device architecture.

Figure 14:
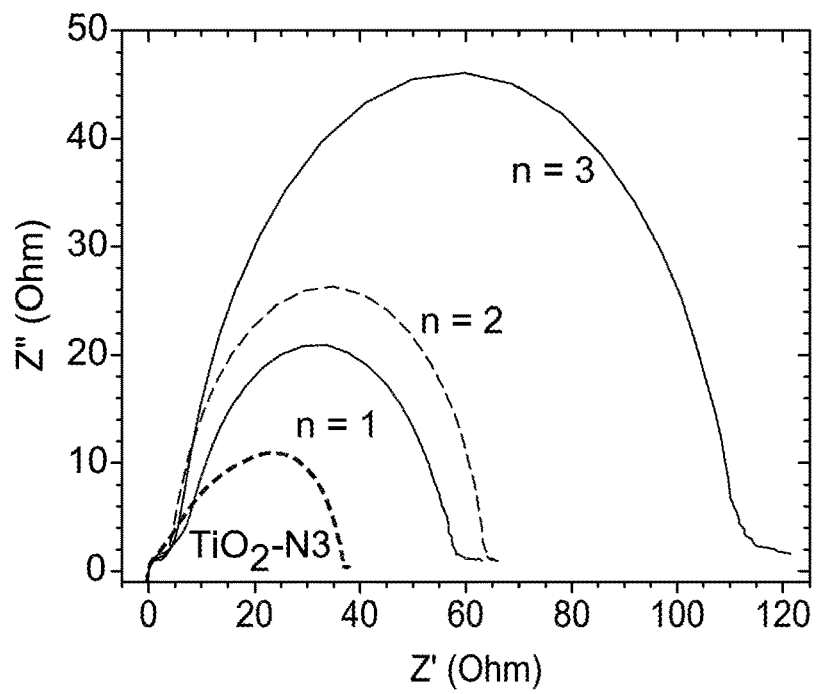
FIG. 14 are Nyquist Plots for cells composed of $TiO_2$—N3 and $TiO_2$—(X)—Zr—N3. (Z' was normalized to correct for sheet resistance).

The influence of the self-assembled multilayer strategy on recombination events was further investigated by electrochemical impedance spectroscopy (EIS) and the results are shown in FIG. 14. In the Nyquist plot, there are two distinct semicircles from $10^6$ to $10^3$ Hz and $10^3$ to 1 Hz. The first and smaller semicircle, attributed to redox reaction at the platinum counter electrodes, is similar regardless of monolayer or multilayer films. This result is expected given that modifications to the $TiO_2$ interface will have minimal influence on electron transfer rate at the platinum counter electrode ($k_{red}$). For the second arc there is a distinct increase in the arc diameter in the order $TiO_2$—N3<$TiO_2$-(1)-Zr—N3<$TiO_2$-(2)-Zr—N3<$TiO_2$-(3)-Zr—N3. The primary contribution to this second arc is charge transfer at the $TiO_2$-dye-electrolyte interface. See Koide, N.; Islam, A.; Chiba, Y.; Han, L., Improvement of Efficiency of Dye-Sensitized Solar Cells Based on Analysis of Equivalent Circuit. *Journal of Photochemistry and Photobiology A: Chemistry* 2006, 182 (3), 296-305. The increased arc diameter is suggestive of reduced recombination rate ($k_{BET}$ and $k_{recom}$) upon incorporation of the bridging molecules. Previous transient absorption experiments showed a ~25% decrease in $k_{BET}$ changing from $TiO_2$—RuC to $TiO_2$-(3)-Zr—RuC. This relatively small change in $k_{BET}$ suggests that the primary contribution to the change in the second arc is due to inhibition of the $TiO_2(e^-)$ to redox mediator recombination event ($k_{recomb}$) and an increase in the electron diffusion time/length in the metal oxide electrode. Presumably the addition of the molecular bridges helps to prevent diffusional contact between $TiO_2$ and $I_3^-$ thus inhibiting this recombination event.

Further support for inhibited recombination at the interface is provided by $V_{oc}$ decay measurements. See FIG. 15. During this measurement the cell is first illuminated under AM1.5 solar irradiation at $V_{oc}$ as to generate a steady state concentration of electrons within the metal oxide electrode. The light is then blocked and $V_{oc}$ is monitored with respect to time. The $V_{oc}$ decreases in the absence of light are indicative of the decrease in electron concentration within the metal oxide primarily by recombining with the redox mediator in the electrolyte solution.

Figure 15:
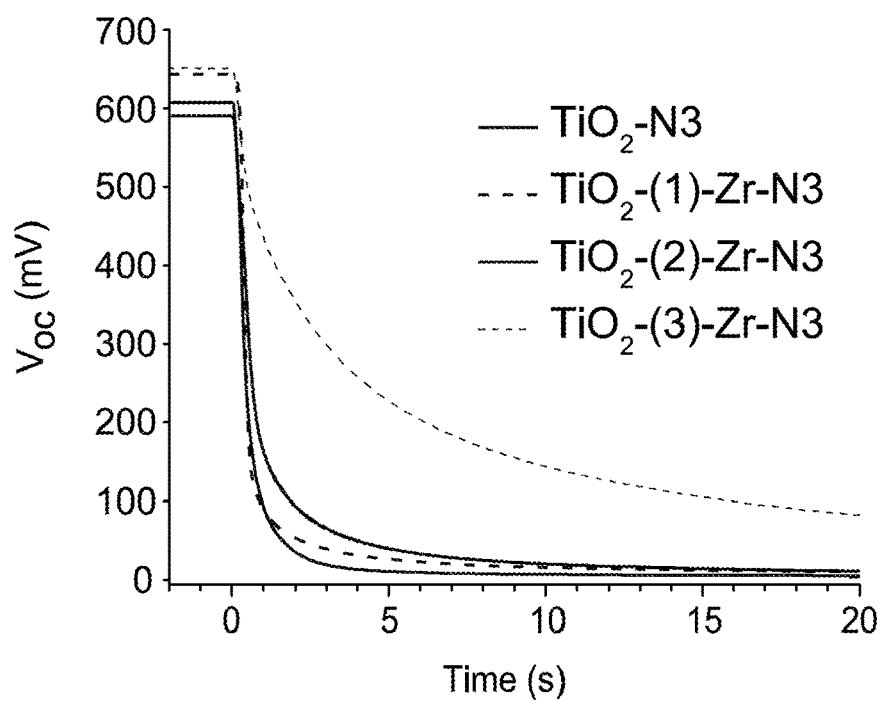
FIG. 15 are plots of open-circuit voltage decay for monolayer and multilayer films composed of $TiO_2$—N3 and $TiO_2$—(X)—Zr—N3 (X=1, 2 and 3) (see FIGS. 2A and 2C).

As can be seen in FIG. 15 the $V_{oc}$ for the monolayer and multilayer films decreases in the order $TiO_2$—N3>$TiO_2$-(1)-Zr—N3>$TiO_2$-(2)-Zr—N3>$TiO_2$-(3)-Zr—N3. These results are again in agreement that the introduction of bridging molecules inhibits recombination events at the metal oxide-dye-electrolyte interface.

Conclusions. We have introduced a new scaffolding, self-assembled multilayers, as a means of controlling electron transfer dynamics at chromophore-metal oxide interfaces in dye-sensitized solar cells. Current-voltage measurements, electrochemical impedance spectroscopy and $V_{oc}$ decay measurements indicate that the multilayer architecture is effective in inhibiting unwanted dye/redox mediator recombination processes which increases both $V_{oc}$ and fill factor of the device. Unfortunately the observed enhances in $V_{oc}$ and FF are far outweighed by the significant decrease in $J_{sc}$ and thus overall device performance decreases with increasing dye-TiO$_2$ separation. However, the self-assembled multilayer strategy is simple and offers considerable flexibility for the selection of chromophore and molecular bridge as compared to other distance modification techniques. We anticipate that with modifications of the structure of molecular bridges, it will be possible to preferentially slow BET over electron injection thus obtaining a higher $J_{sc}$ increased $V_{oc}$ and increased overall device efficiencies.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above products and methods without departing from the scope of the invention, it is intended that all matter contained in the above description and shown in the accompanying drawings shall be interpreted as illustrative and not in a limiting sense.

What is claimed is:

1. A multilayer structure having the following general structure (III):

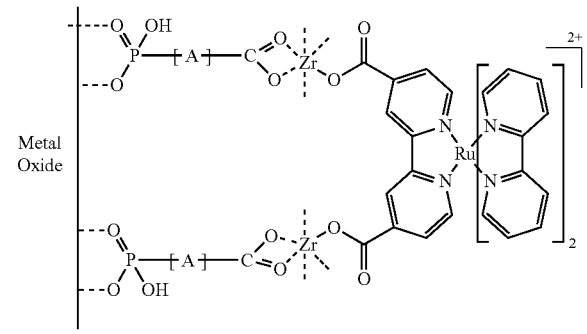

wherein each A is a bridging molecule, and further wherein A consists of two or three of

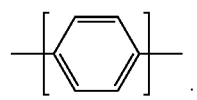

2. The multilayer structure of claim 1 wherein the metal oxide is selected from the group consisting of SiO$_2$, SnO$_2$, TiO$_2$, Nb$_2$O$_5$, SrTiO$_3$, ZnO, Zn$_2$SnO$_4$, ZrO$_2$, NiO, Ta-doped TiO$_2$, Nb-doped TiO$_2$, and any combination thereof.

3. A multilayer structure having the following general structure (IV):

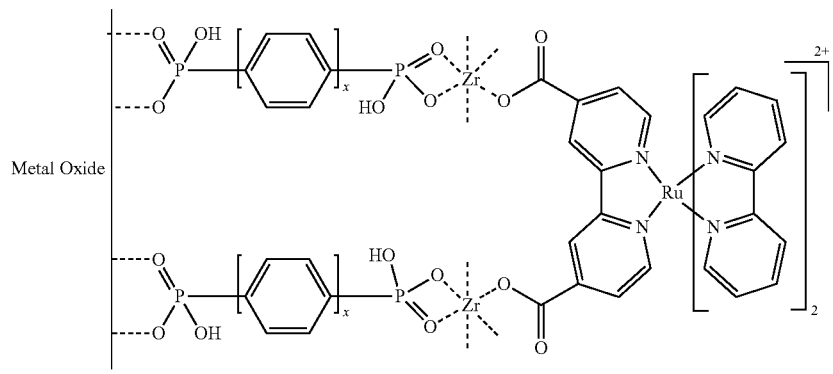

wherein X is two or three.

4. The multilayer structure of claim 3 wherein the metal oxide is selected from the group consisting of SiO$_2$, SnO$_2$, TiO$_2$, Nb$_2$O$_5$, SrTiO$_3$, ZnO, Zn$_2$SnO$_4$, ZrO$_2$, NiO, Ta-doped TiO$_2$, Nb-doped TiO$_2$, and any combination thereof.

* * * * *